US009684044B2

(12) United States Patent
Habara et al.

(10) Patent No.: US 9,684,044 B2
(45) Date of Patent: Jun. 20, 2017

(54) MAGNETIC RESONANCE IMAGING APPARATUS AND ANTENNA DEVICE

(71) Applicants: Hideta Habara, Tokyo (JP); Yoshihisa Soutome, Tokyo (JP); Hiroyuki Takeuchi, Tokyo (JP); Hisaaki Ochi, Tokyo (JP)

(72) Inventors: Hideta Habara, Tokyo (JP); Yoshihisa Soutome, Tokyo (JP); Hiroyuki Takeuchi, Tokyo (JP); Hisaaki Ochi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 555 days.

(21) Appl. No.: 14/349,424

(22) PCT Filed: Oct. 17, 2012

(86) PCT No.: PCT/JP2012/076759
§ 371 (c)(1),
(2) Date: Apr. 3, 2014

(87) PCT Pub. No.: WO2013/065480
PCT Pub. Date: May 10, 2013

(65) Prior Publication Data
US 2014/0253126 A1     Sep. 11, 2014

(30) Foreign Application Priority Data

Nov. 1, 2011   (JP) ................................ 2011-240384

(51) Int. Cl.
*G01R 33/34*     (2006.01)
*G01R 33/3415*   (2006.01)
(Continued)

(52) U.S. Cl.
CPC ... *G01R 33/34092* (2013.01); *G01R 33/3415* (2013.01); *G01R 33/3453* (2013.01); *G01R 33/36* (2013.01); *G01R 33/365* (2013.01)

(58) Field of Classification Search
CPC   G01R 33/3415; G01R 33/3453; G01R 33/36; G01R 33/365
See application file for complete search history.

(56) References Cited

U.S. PATENT DOCUMENTS

| | | |
|---|---|---|
| 6,255,816 B1 | 7/2001 | Robitaille |
| 2007/0229076 A1 | 10/2007 | Habara et al. |

(Continued)

FOREIGN PATENT DOCUMENTS

| | | |
|---|---|---|
| JP | 2007-275164 | 10/2007 |
| JP | 2008-199204 | 8/2008 |
| WO | WO 2011/065532 | 6/2011 |

OTHER PUBLICATIONS

International Search Report in PCT/JP2012/076759.

*Primary Examiner* — Gregory H Curran
(74) *Attorney, Agent, or Firm* — Cooper & Dunham LLP

(57) ABSTRACT

In order to provide a technique which can suppress coupling to homogenize the spatial distribution of an RF magnetic field and can improve penetration of the RF magnetic field into the subject, pad-like electric field conductors having a predetermined area are provided outside both ends of a rung conductor as a part of a configuration which forms a loop-like circuit and is driven as an antenna. An antenna device includes a sheet-like conductor, a rung conductor which is arranged at a predetermined distance from the sheet-like conductor, two electric field conductors which are arranged in both end portions of the rung conductor at a predetermined distance from the sheet-like conductor, and connection terminals which are transmission and reception terminals provided in the rung conductor and the sheet-like (Continued)

conductor. The rung conductor and the sheet-like conductor configure a loop circuit which resonates at a preset frequency.

20 Claims, 15 Drawing Sheets

(51) Int. Cl.
    *G01R 33/345*     (2006.01)
    *G01R 33/36*     (2006.01)

(56) References Cited

U.S. PATENT DOCUMENTS

2010/0253350 A1\* 10/2010 Huish .............. G01R 33/34007
                                                                       324/318
2012/0262173 A1    10/2012 Soutome et al.

\* cited by examiner

FIG.3
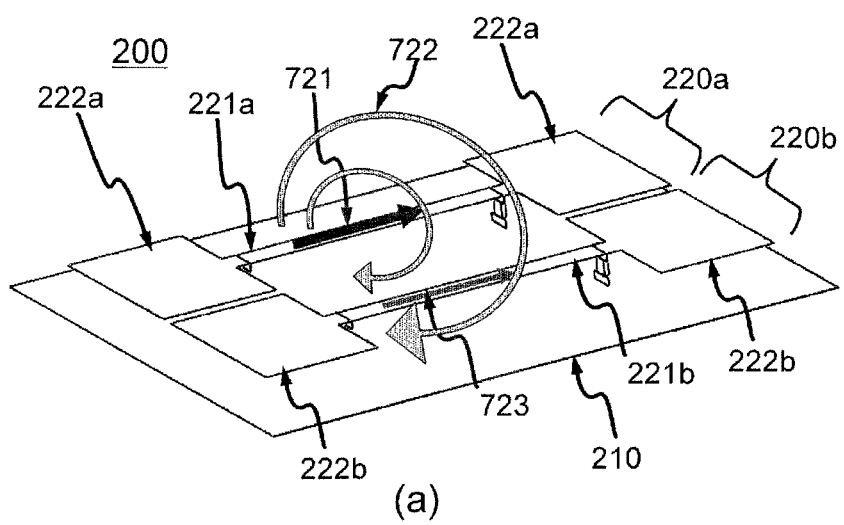
(a)
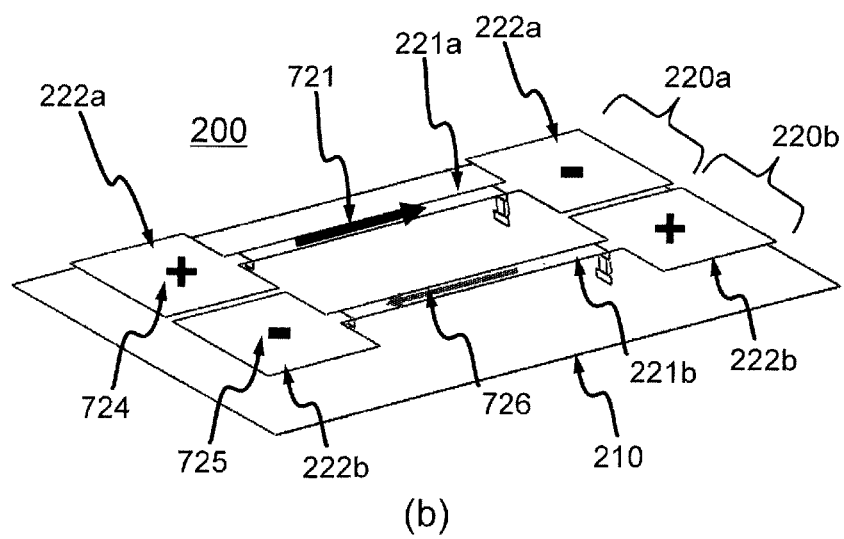
(b)

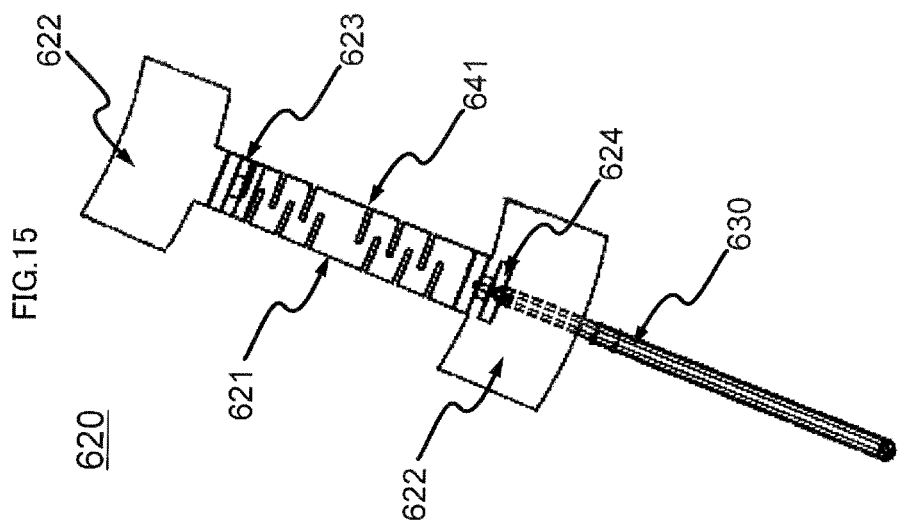

MAGNETIC RESONANCE IMAGING APPARATUS AND ANTENNA DEVICE

TECHNICAL FIELD

The present invention relates to a nuclear magnetic resonance imaging (hereinafter, referred to as MRI) technique which measures a nuclear magnetic resonance (hereinafter, referred to as NMR) signal from hydrogen, phosphorus, or the like in a subject and images a nuclear density distribution, a relaxation time distribution, or the like, and in particular, to an antenna device which performs at least one of transmission of a high-frequency signal and reception of an NMR signal.

BACKGROUND ART

In an MRI apparatus, an electromagnetic-wave high-frequency signal is irradiated onto a subject arranged in a homogeneous magnetostatic field generated by a magnetostatic field magnet to excite a nuclear spin in the subject and to receive an electromagnetic-wave nuclear magnetic resonance signal generated from the nuclear spin, and signal processing is performed to image the subject. Irradiation of the high-frequency signal and reception of the nuclear magnetic resonance signal are performed by a device, called an RF antenna or an RF coil, which transmits or receives an electromagnetic wave having a radio frequency (RF).

As the type of RF coil, there are a transmission antenna which performs only transmission, a reception antenna which performs only reception, and a transmission and reception antenna which performs both transmission and reception. In an MRI apparatus for human imaging which has magnetostatic field strength equal to or less than 3 tesla, in many cases, a large transmission antenna having a cylindrical shape or a disk shape and a comparatively small reception antenna having various shapes, such as a sheet-like shape and a cylindrical shape, are used in combination.

As an example of a cylindrical transmission antenna, there are a transmission antenna called a bird cage type (for example, see NPL 1 and PTL 1) and a transmission antenna called a TEM type (for example, see PTL 2 and PTL 3). In these transmission antennas, usually, 16 to 32 rod-like conductors arranged in parallel with a cylindrical center axis called a rung (a crosspiece or a crossbar of a ladder) are provided along the lateral surface of the cylinder. The cylindrical transmission antenna is used in an MRI apparatus called a tunnel type. In the tunnel type MRI apparatus, a cylindrical magnetostatic field magnet is arranged to form a tunnel, a subject enters the tunnel in a state of being laid on a bed, and imaging is performed.

As an example of a reception antenna, for example, there is an example where a conductor is bent in a loop shape (for example, see PTL 4), an example where a conductor is bent in a shape of a figure eight (for example, see NPL 2), or the like. Since the reception antenna is arranged closer to the subject than the transmission antenna, while sensitivity is high compared to a volume antenna, in many cases, a sensitive region is partially narrowed.

CITATION LIST

Patent Literature

[PTL 1] U.S. Pat. No. 7,688,070
[PTL 2] U.S. Pat. No. 4,751,464
[PTL 3] U.S. Pat. No. 5,557,247
[PTL 4] JP-T-2004-511278

Non Patent Literature

[NPL 1] Cecil E. Hayes, et al., "An Efficient, Highly Homogeneous Radiofrequency Coil for Whole-Body NMR Imaging at 1.5T", Journal of Magnetic Resonance (1985) Vol. 63: p. 622-628
[NPL 2] Xiaoliang Zhang, et al, "Higher-Order Harmonic Transmission-Line RF Coil Design for MR Applications", Magnetic Resonance in Medicine (2005) Vol. 53: p. 1234

SUMMARY OF INVENTION

Technical Problem

In recent years, in the tunnel type MRI apparatus, a high magnetic field of 3 tesla or 7 tesla has been used. In a high-magnetic field MRI apparatus equal to or greater than 3 tesla, since the wavelength of an RF electromagnetic wave (also referred to as RF magnetic field) inside a human body is shortened, a standing wave is likely to be present, and the spatial distribution of the RF magnetic field becomes inhomogenous. In contrast, an attempt is made to increase the number of channels of the transmission antenna and to control the respective channels, thereby reducing inhomogeneity. However, if the number of channels of the transmission antenna increases, interference called coupling between the channels occurs, and antenna performance is deteriorated. Similarly to the transmission antenna, coupling between the channels occurs in the reception antenna.

Aside from coupling, since a subject is a conductor, such as a human body, if an RF magnetic field is irradiated toward the subject, a shielding current called an eddy current flows on the surface of the subject. The shielding current obstructs penetration of the RF magnetic field into the subject, and a nuclear spin inside the subject is not sufficiently excited.

In this way, if an antenna of the related art is used directly in an MRI apparatus using a high magnetic field, a sufficient RF magnetic field may not spread into the subject. The spatial distribution of the RF magnetic field becomes inhomogenous, and if a multichannel configuration is made to prevent inhomogeneity or if a multichannel configuration is made to achieve high-speed imaging, coupling between the channels is likely to occur.

The invention has been accomplished in consideration of the above-described situation, and an object of the invention to provide a technique which realizes an RF coil capable of suppressing coupling to homogenize the spatial distribution of an RF magnetic field regardless of magnetic field strength of an MRI apparatus and improving penetration of the RF magnetic field into a subject.

Solution to Problem

The invention resides in that pad-like electric field conductors having a predetermined area are provided outside both ends of a rung conductor as a part of a configuration which forms a loop-like circuit and is driven as an antenna.

The invention provides a magnetic resonance imaging apparatus including a magnet which generates a magnetostatic field and forms a magnetostatic field, and an RF coil which performs at least one of transmission of a high-frequency signal to the magnetostatic field and reception of a nuclear magnetic resonance signal generated from a subject placed inside the magnetostatic field, in which the RF coil includes a sheet-like conductor and an antenna unit, the antenna unit includes a rung conductor which is arranged at a predetermined distance from the sheet-like conductor, and two electric field conductors which are arranged in both end portions of the rung conductor at a predetermined distance from the sheet-like conductor, and the rung conductor and the sheet-like conductor configure a loop circuit which resonates at the frequency of the high-frequency signal transmitted from the RF coil or the nuclear magnetic resonance signal received by the RF coil.

The invention provides an antenna device including a sheet-like conductor, and an antenna unit, in which the antenna unit includes a rung conductor which is arranged at a predetermined distance from the sheet-like conductor, and two electric field conductors which are arranged in both end portions of the rung conductor at a predetermined distance from the sheet-like conductor, and the rung conductor and the sheet-like conductor configure a loop circuit which resonates at a preset frequency.

Advantageous Effects of Invention

According to the invention, it is possible to realize an RF coil capable of suppressing coupling to homogenize the spatial distribution of an RF magnetic field regardless of magnetic field strength of an MRI apparatus and improving penetration of the RF magnetic field into a subject.

BRIEF DESCRIPTION OF DRAWINGS

FIG. 3(a) is an explanatory view illustrating magnetic field coupling of a two-channel antenna device, and FIG. 3(b) is an explanatory view illustrating electric field coupling of the antenna device of this embodiment.

FIG. 15 is a perspective view of an antenna unit of a modification example of the antenna device of the fourth embodiment.

DESCRIPTION OF EMBODIMENTS

<<First Embodiment>>

Hereinafter, a first embodiment to which the invention is applied will be described.

Figure 1:
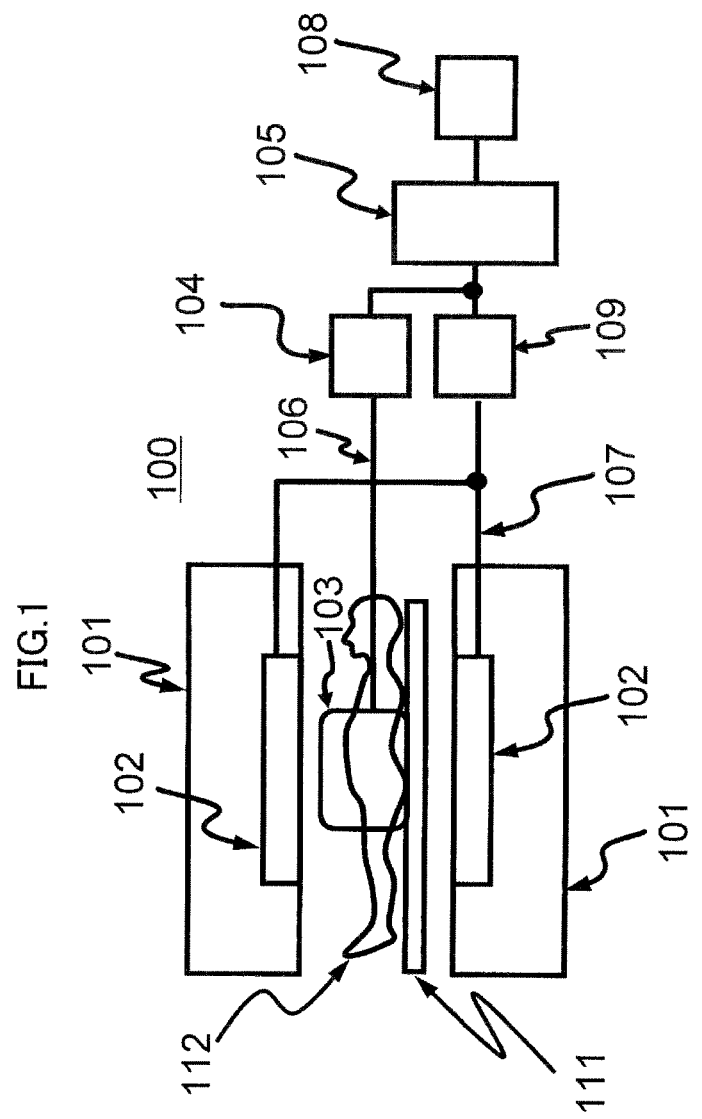
FIG. 1 is a schematic configuration diagram of an MRI apparatus of a first embodiment.

First, the configuration of an MRI apparatus of this embodiment will be described. FIG. 1 is a schematic configuration diagram of an MRI apparatus 100 of this embodiment. The MRI apparatus 100 includes a magnet 101 which forms a magnetostatic field inside a measurement space where a subject 112 is placed, a gradient magnetic field coil 102 which provides a magnetic field gradient in a predetermined direction to the magnetostatic field, an RF coil 103 which transmits a high-frequency signal to the subject 112 and receives a nuclear magnetic resonance signal generated from the subject 112, a transceiver 101 which creates the high-frequency signal transmitted from the RF coil 103, transmits the high-frequency signal to the RF coil 103, and performs signal processing on the nuclear magnetic resonance signal received by the RF coil 103, a gradient magnetic field power source 109 which supplies a current to the gradient magnetic field coil 102, a data processing unit 105 which controls the driving of the transceiver 104 and the gradient magnetic field power source 109, and performs various kinds of information processing and operation by an operator, a display device 108 which displays the processing result of the data processing unit 105, and a bed 111 on which the subject 112 is laid. The data processing unit 105 functions as an imaging unit which images internal information of the subject 112 from the nuclear magnetic resonance signal received by the RF coil 103 and subjected to various kinds of signal processing by the transceiver 104.

The gradient magnetic field power source 109 and the gradient magnetic field coil 102 are connected by a gradient magnetic field control cable 107. The RF coil 103 and the transceiver 104 are connected by a transmission and reception cable 106, through which a signal is transmitted or received between the RF coil 103 and the transceiver 104. Though not shown, the transceiver 104 includes a synthesizer, a power amplifier, a reception mixer, an analog-to-digital converter, a transmission and reception selection switch, and the like.

The MRI apparatus 100 is classified into a horizontal magnetic field type and a vertical magnetic field type depending on the direction of the magnetostatic field formed by the magnet 101. In the horizontal magnetic field type, in general, the magnet 101 has a cylindrical bore (center space) and generates a magnetostatic field in a horizontal direction of FIG. 1. In the vertical magnetic field type, a pair of magnets are arranged in a vertical direction with a subject interposed therebetween, and a magnetostatic field in a vertical direction of FIG. 1 is generated.

In the MRI apparatus 100 having the above-described configuration, an intermittent high-frequency signal at an interval of several milliseconds and a gradient magnetic field are irradiated by the RF coil 103 and the gradient magnetic field coil 102 onto the subject 112 placed inside the magnetostatic field. A nuclear magnetic resonance signal which is emitted from the subject 112 in resonance with the high-frequency signal is received, and signal processing is performed to acquire a magnetic resonance image. The subject 112 is, for example, a predetermined region of a human body. The subject 112 is laid on the bed 111 or is placed inside the RF coil 103. The high-frequency signal and the gradient magnetic field are transmitted and applied by the RF coil 103 and the gradient magnetic field coil 102. The RF coil 103, the gradient magnetic field coil 102, and the bed 111 are arranged inside a magnetostatic field space formed by the magnet 101.

In FIG. 1, although a single RF coil is described as the RF coil 103 which performs transmission of the high-frequency signal and reception of the nuclear magnetic resonance signal, the invention is not limited thereto. For example, an RF coil having a plurality of coils, such as a combination of an RF coil for wide-range imaging and a local RF coil, may be used as the RF coil 103. When there is no need for distinction, the high-frequency signal which is transmitted from the RF coil 103 and the nuclear magnetic resonance signal which is received by the RF coil 103 are collectively referred to as electromagnetic waves.

This embodiment provides the RF coil 103 which can suppress coupling between channels and can improve penetration of the RF magnetic field into the human body even in a multichannel coil. Hereinafter, the details of the RF coil 103 of this embodiment for realizing this will be described referring to the drawings. Here, for example, a case where an antenna device 200 having a shape close to a planar shape is used as the RF coil 103 will be described.

Figure 2:
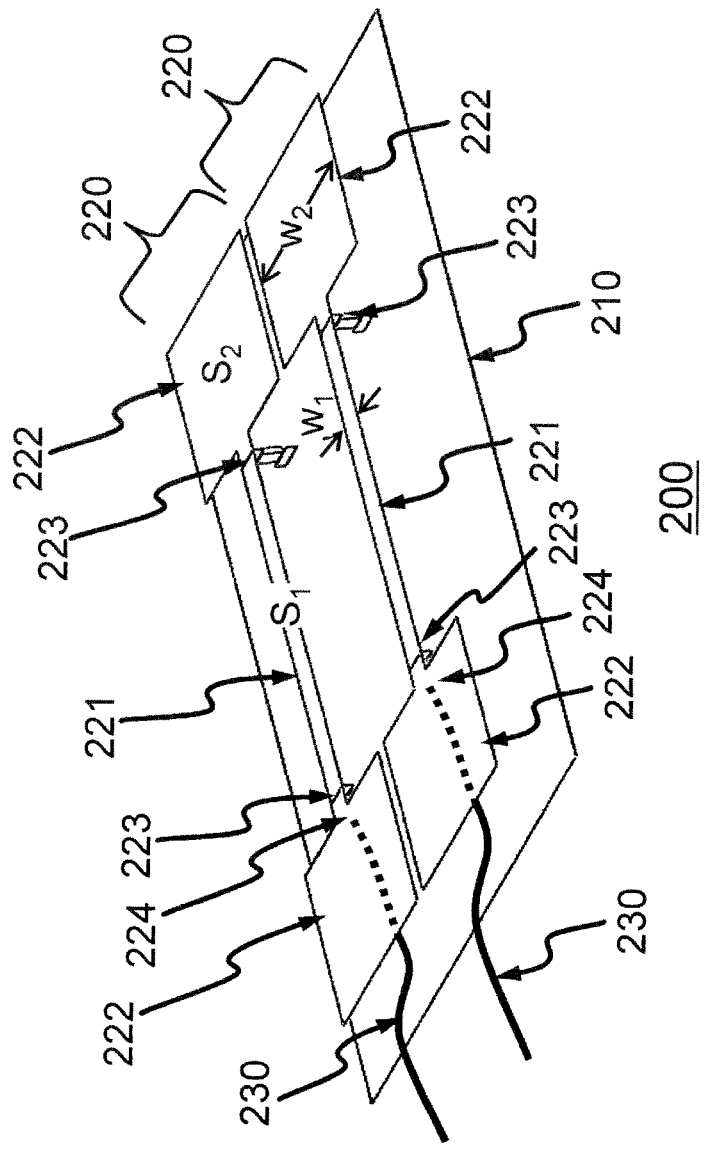
FIG. 2 is a perspective view of an antenna device of the first embodiment.

FIG. 2 is a perspective view of the antenna device 200 which is used as the RF coil 103 of this embodiment. As shown in this drawing, the antenna device 200 of this embodiment includes a sheet-like conductor 210 which plays role of a ground plane, and antenna units 220. Each of the antenna units 220 includes a rung conductor 221, electric field conductors 222, frequency adjustment capacitors 223, and a connection terminal 224.

The function as an antenna which resonates at a predetermined frequency and performs at least one of transmission and reception of electromagnetic waves is realized by the sheet-like conductor 210, the rung conductor 221, the frequency adjustment capacitors 223, and the connection terminal 224. In FIG. 2, a case where two antenna units 220 are arranged on one sheet-like conductor 210 to configure a two-channel antenna device 200 is illustrated.

The rung conductor 221 is formed of one or more elongates flat plate or tape-like, rod-like, or tubular conductor. In case of an elongated flat plate-like conductor, the plate-like surface is substantially arranged in parallel with the surface of the sheet-like conductor 210. In case of a tape-like conductor, in many cases, if the tape surface is substantially arranged in parallel with the surface of the sheet-like conductor 210, it is advantageous in terms of effective space use and performance. The rung conductor 221 is arranged at a predetermined distance (space) from the sheet-like conductor 210 on the side of the sheet-like conductor 210 on which the subject 112 is placed. The rung conductor 221 is substantially arranged in parallel with the rung conductor 221 of the adjacent antenna unit 220 (channel).

The electric field conductors 222 are formed of a plate-like conductor having a predetermined area, and are electrically connected to both ends of the rung conductor 221. At this time, it is preferable that connection is made such that electrical resistance is equal to or smaller than 0.1Ω, and substantially becomes zero. Similarly to the rung conductor 221, the electric field conductor 222 is arranged at a predetermined distance (space) from the sheet-like conductor 210 on the side of the sheet-like conductor 210 on which the subject 112 is placed such that the plate-like surface is substantially parallel to the surface of the sheet-like conductor. The electric field conductors 222 are arranged so as to be close to the electric field conductors 222 of the adjacent antenna unit (channel) 220.

The electric field conductors 222 have a plate-like shape as described above, and a voltage provided to the rung conductor 221 is transmitted to the electric field conductors 222 to generate an electric field. This electric field suppresses a shielding current which flows on the surface of the subject 112 by a magnetic field produced by a current flowing in the rung conductor 221.

As in this embodiment, in case of the multichannel antenna device 200, the width $w_2$ of each of the electric field conductors 222 in the minor axis direction of the rung conductor 221 (in the direction where the two rung conductors 221 are adjacent to each other) is greater than the width $w_1$ of the rung conductor 221. This is to reduce coupling between channels as described below. It is preferable that the area $S_2$ of each of the electric field conductors 222 is greater than the area $S_1$ of the rung conductor 221. This is to improve penetration of the RF magnetic field into a deep portion of the subject 112 as described below.

The frequency adjustment capacitors 223 are respectively arranged between both end portions of the rung conductor 221 and the sheet-like conductor 210 substantially directly beneath the rung conductor 221, and respectively connect both end portions of the rung conductor 221 and the sheet-like conductor 210. When the number of rung conductors 221 is N, the number of frequency adjustment capacitors 223 is 2N.

In this way, both end portions of the rung conductor 221 are respectively connected by the frequency adjustment capacitors 223, and the two frequency adjustment capacitors 223, the one rung conductor 221, and the sheet-like conductor 210 form a loop-like circuit. The value of each of the frequency adjustment capacitors 223 is adjusted such that the antenna device 200 resonates at a frequency to be used in the MRI apparatus 100. Accordingly, the antenna device 200 transmits and receives electromagnetic waves having a predetermined frequency as the RF coil 103 of the MRI apparatus 100. For the frequency adjustment capacitors 223, for example, a capacitor having a value of several pF to tens of pF is used.

The electric field conductors 222 have a wide area, and since the electric field conductors 222 face the sheet-like conductor 210, the electric field conductors 222 spatially have a capacitor component. For this reason, the capacitance of a capacitor which contributes to the determination of the resonance frequency of the antenna device 200 becomes the sum of the capacitance of each of the frequency adjustment capacitors 223 as an element and the capacitor component by each of the electric field conductors 222 and the sheet-like conductor 210. When determining the capacitance of each of the frequency adjustment capacitors 223, the capacitor component by each of the electric field conductors 222 and the sheet-like conductor 210 is also taken into consideration.

The connection terminal 224 is a transmission and/or reception terminal which is provided on one end portion of the rung conductor 221 and the directly beneath sheet-like conductor 210. An end portion of the coaxial cable 230 is connected to the connection terminal 224 provided on the rung conductor 221 and the directly beneath sheet-like conductor 210. That is, an inner conductor and an outer conductor of the coaxial cable 230 are respectively connected to the rung conductor 221 side and the sheet-like conductor 210 side of the connection terminal 224. The coaxial cable 230 is used as the above-described transmission and reception cable 106, and connects the antenna device 20C and the apparatus body (transceiver 104) of the MRI apparatus 100. The antenna device 200 transmits and receives electromagnetic waves through the coaxial cable 230. The connection terminal 224 is also called a transmission and reception terminal, a port of the antenna device 200, a feed point, or the like. The connection terminal 224 is provided for each channel.

For example, the connection terminal 224 may be configured to have the function of a matching circuit using several lumped constant elements, such as capacitors or inductors.

Though not shown, the antenna device 200 of this embodiment has a conductor support structure in which the rung conductor 221 and the electric field conductors 222 are arranged at a predetermined distance from the sheet-like conductor 210.

Hereinafter, a case where the multichannel (two-channel) antenna device 200 of this embodiment having the above-described configuration can reduce interference (coupling) between channels and can improve penetration of the RF magnetic field into the subject 112 will be described.

First, a case where the antenna device 200 of this embodiment can reduce interference (coupling) between channels will be described referring to FIGS. 3(a) and 3(b).

In the antenna device 200 of this embodiment, two rung conductors 221 are arranged adjacent to each other. Here, the two rung conductors 221 are respectively referred to as rung conductors 221a and 221b. The electric field conductors 222 connected to the rung conductors 221a and 221b are respectively referred to as electric field conductors 222a and 222b, and antenna units 220 including the rung conductors 221a and 221b and the electric field conductors 222a and 222b are respectively referred to as an antenna unit 220a and an antenna unit 220b.

As shown in FIG. 3(a), if an AC current 721 flows in one rung conductor 221a, the two rung conductors 221a and 221b cause coupling through a magnetic field 722 produced by the AC current, and a force acts to make a current 723 in the same phase flow in the other rung conductor 221b. Conversely, if a current flows in the rung conductor 221b, similarly, a force acts to make a current in the same phase flow in the rung conductor 221a. This is called magnetic field coupling.

In the antenna device 200 of this embodiment, the electric field conductors 222 are respectively connected to both end portions of the rung conductor 221. As shown in FIG. 3(b), if the current 721 flows in the one rung conductor 221a, an electric charge 724 is generated in the electric field conductor 222a, and an electric charge 725 having an opposite sign is generated in the electric field conductor 222b of the adjacent channel (antenna unit 220b). A voltage is generated in the adjacent antenna unit 220b by an electric charge 725 having an opposite sign, and a force acts to make a reverse current 726 flow in the other rung conductor 221b. Conversely, if a current flows in the rung conductor 221b, a force acts to make a reverse current flow in the rung conductor 221a. This is called electric field coupling.

For example, if the current 721 flows in the rung conductor 221a, a force acts to make a reverse current (723, 726) flow in the rung conductor 221b by the magnetic field coupling and the electric field coupling described herein. Accordingly, a force by the electric field coupling of the electric field conductor 222a and the electric field conductor 222b is brought close to the force by the magnetic field coupling, whereby the current flowing in the rung conductor 221b by coupling between adjacent channels can be brought close to zero. For example, when the two forces are balanced, even if the current 721 flows in the rung conductor 221a, no current flows in the rung conductor 221b. That is, the two forces are balanced, and thus, when the current 721 flows in the rung conductor 221a, the current flowing in the rung conductor 221b by coupling between adjacent channels can be brought to zero.

In the antenna device 200 of this embodiment, as shown in FIG. 2, the electric field conductors 222 of the two adjacent antenna units 220 are arranged close to each other. The electric field conductors 222 of the adjacent antenna units 220 are arranged close to each other, whereby the force by the electric field coupling increases and is brought close to the force by the magnetic field coupling, and interference (coupling) between channels is reduced.

Making the electric field conductors 222 of the adjacent antenna units 220 close to each other can be realized by making the interval between the electric field conductors 222 of the adjacent antenna units 220 narrower than the interval between the rung conductors 221 of the adjacent antenna units 220. For example, in this embodiment, the width $w_2$ of each of the electric field conductors 222 is greater than the width $w_1$ of the rung conductor 221, whereby the interval between the electric field conductors 222 of the adjacent antenna units 220 is narrower than the interval between the rung conductors 221.

For example, the sheet-like conductor 210 is formed of a copper foil having a width of 360 millimeters, a length of 400 millimeters, and a thickness of 30 microns, the rung conductor 221 having a width $w_1$ of 20 millimeters and a length of 200 millimeters is arranged at a distance of 20 millimeters from the sheet-like conductor 210, and the electric field conductors 222 having a width $w_2$ of 130 millimeters and a length of 80 millimeters are connected to both ends of the rung conductor 221, thereby configuring the antenna device 200 of this embodiment. The rung conductor 221 and the electric field conductors 222 are formed of, for example, a conductor, such as a copper foil. If the interval between the electric field conductors 222 of the adjacent channels is 10 millimeters, the interval can be configured narrower than the interval of 120 millimeters between the adjacent rung conductors 221.

Next, a case where the antenna device 200 of this embodiment has the electric field conductors 222 to suppress a shielding current on the surface of the subject 112 and to enhance penetration of the magnetic field into the subject 112 will be described referring to FIGS. 4 and 5.

Figure 4:
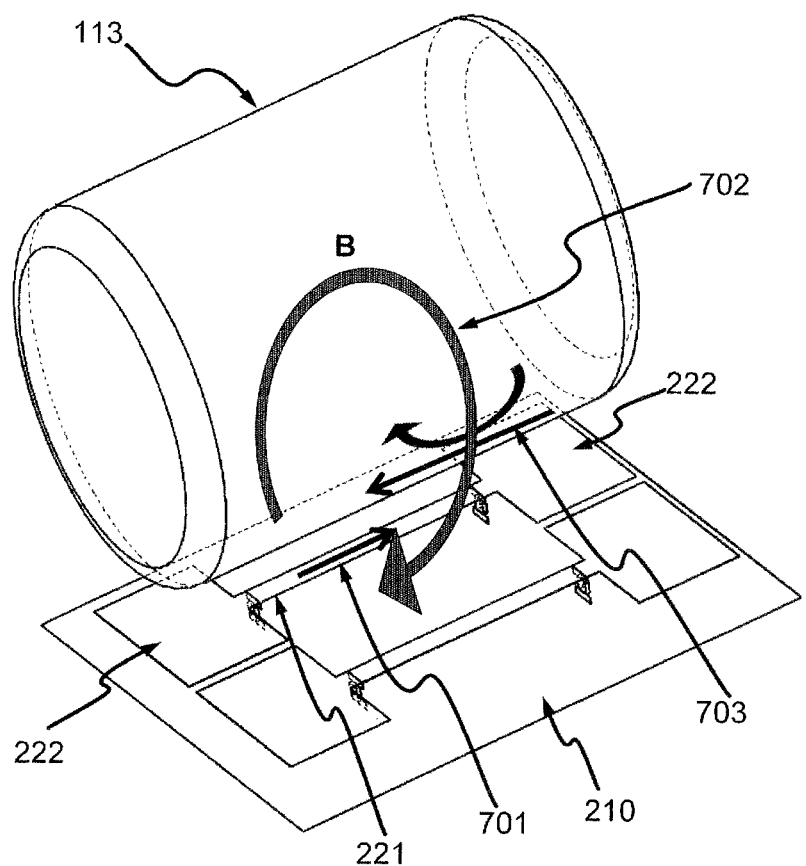
FIG. 4 is an explanatory view illustrating a shielding current which is generated in a phantom with application of an RF magnetic field.
Figure 5:
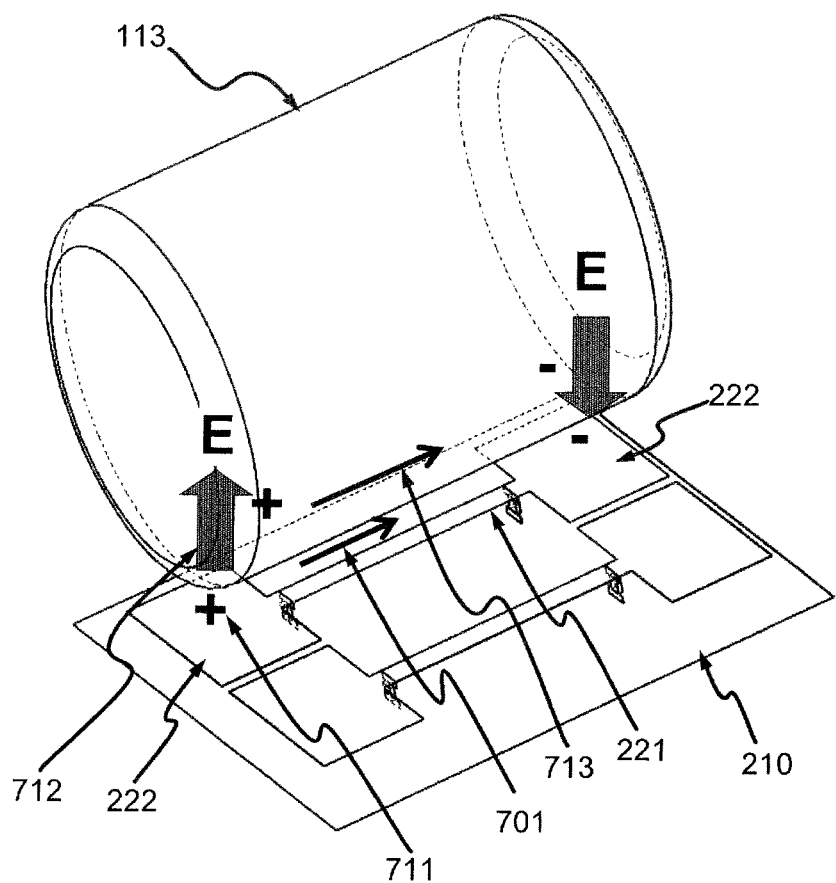
FIG. 5 is an explanatory view illustrating the effect of a voltage provided to electric field conductors of the antenna device of this embodiment on a phantom.

FIGS. 4 and 5 show a predetermined instantaneous current, a magnetic flux line, and an electric field when an AC voltage is applied to the antenna device 200. Here, a phantom 113 ng a living body is used as the subject 112. The phantom 113 has a cylindrical shape, and an aqueous solution containing water and an electrolyte are sealed inside the phantom 113. The aqueous solution filled inside the phantom 113 has predetermined electrical conductivity. For example, when simulating a head of a human, the size of the phantom 113 has a diameter of 20 centimeters and a length of about 30 centimeters.

FIG. 4 is a diagram illustrating the effect of a magnetic flux line 702 generated by the AC current 701 flowing in the rung conductor 221 on the phantom 113. If the current 701 flows, a magnetic flux line (B) 702 is generated so as to surround the current 701 by a Maxwell equation. The magnetic flux line (B) 702 passes between the sheet-like conductor 210 and the rung conductor 221, enters from the cylindrical lateral surface of the phantom 113, and tries to penetrate the phantom 113.

At this time, since the aqueous solution inside the phantom 113 simulating a living body has electrical conductivity, an eddy current (surface current) 703 is generated on the surface of the phantom 113 against the magnetic flux line (B)

702 which tries to penetrate the phantom 113. The eddy current (surface current) 703 acts to interrupt the penetration of the magnetic flux line 502. The eddy current (surface current) 703 flows in parallel with and in a direction opposite to the current flowing in the rung conductor 221 on the cylindrical lateral surface closest to the rung conductor 221.

FIG. 5 is a diagram illustrating the effect of a voltage 711 provided to the electric field conductor 222 by the AC current 701 flowing in the rung conductor 221 on the phantom 113. If the current 701 flows, of the electric field conductors 222 at both ends of the rung conductor 221, a positive voltage 711 is provided to one electric field conductor 222. As shown in FIG. 5, an electric field (E) 712 having a polarity is generated from the electric field conductors 222, to which the positive voltage 711 is provided, with respect to the cylindrical end portions of the phantom 113. Here, the electric field (E) 712 is generated up to the other end portion of the phantom 113, a positive voltage appears on the left side of the drawing, and a negative voltage appears on the right side of the drawing. A current 713 is excited in a portion on the surface of the phantom 113 close to the rung conductor 221 by the electric field (E) 712. The direction of the current 713 is opposite to the eddy current (surface current) 703 shown in FIG. 4.

Accordingly, the current 713 which is generated on the surface of the phantom 113 by the electric field (E) 712 cancels the eddy current (surface current) 703 flowing on the surface of the phantom 113. That is, it is possible to suppress the eddy current 703 on the surface of the phantom 113 by the electric field 712 generated by the voltage 711 provided to the electric field conductors 222. Then, the eddy current 703 is suppressed, the interruption of penetration of the magnetic flux line 702 is reduced, and the magnetic flux line 702 penetrates into the phantom 113 more deeply.

In order that an electric field is more effectively provided to the subject 112 by the electric field conductor 222, it is preferable that the area of the electric field conductor 222 is large. In this embodiment, the horizontal width $w_2$ of each of the electric field conductors 222 is greater than the horizontal width $w_1$ of the rung conductor 221, thereby realizing the electric field conductors 222 having a wide area. In the antenna device 200 of this embodiment, the greater the area of each of the electric field conductors 222, the more efficiently an electric field can be provided to the subject 112. However, it should suffice that the electric field conductors 222 have an area so as to generate an electric field capable of suppressing the eddy current 703.

As described above, the MRI apparatus of this embodiment includes the magnet 101 which generates a magnetostatic field and forms a magnetostatic field, and the RF coil 103 which performs at least one of transmission of a high-frequency signal to the magnetostatic field and reception of a nuclear magnetic resonance signal generated from a subject placed inside the magnetostatic field, in which the RF coil 103 includes the sheet-like conductor 210 and the antenna unit 220, the antenna unit 220 includes the rung conductor 221 which is arranged at a predetermined distance from the sheet-like conductor 210, and the two electric field conductors 222 which are arranged in both end portions of the rung conductor 221 at a predetermined distance from the sheet-like conductor 210, and the rung conductor 221 and the sheet-like conductor 210 configure a loop circuit which resonates at the frequency of the high-frequency signal transmitted from the RF coil 103 or the nuclear magnetic resonance signal received by the RF coil 103.

The electric field conductor 222 generates an electric field enough to suppress a shielding current which flows on the surface of the subject by a magnetic field produced by the current flowing in the rung conductor 221. The RF coil 103 is a multichannel antenna including a plurality of antenna units 220, and the electric field conductors 222 of each antenna unit 220 cause the electric field conductors 222 of the adjacent antenna unit 220 to generate a voltage for suppressing magnetic field coupling between the rung conductors 221 of the adjacent antenna units 220.

The two frequency adjustment capacitors 223 which connect both end portions of the rung conductor 221 and the sheet-like conductor 210 directly beneath the rung conductor 221 are further provided, and the value of each of the frequency adjustment capacitors 223 is adjusted such that the loop circuit resonates at the frequency of the high-frequency signal or the nuclear magnetic resonance signal. The rung conductor 221 and the electric field conductors 222 are electrically connected together.

The interval between the electric field conductors 222 of the adjacent antenna units 220 may be narrower than the interval between the rung conductors 221 of the adjacent antenna units 220. The area of each of the electric field conductors 222 may be determined so as to generate the electric field.

That is, in this embodiment, the antenna device 200 which is used as the RF coil 103 includes the electric field conductors 222 having a predetermined area at both ends of the rung conductor 221 as a constituent element of an antenna, which transmits and receives electromagnetic waves. The electric field conductors 222 are provided, whereby the antenna device 200 of this embodiment can reduce a coupling current between adjacent channels, can suppress a shielding current on the surface of the subject 112, and can improve penetration of the RF magnetic field into the subject.

The antenna device 200 is used as the RF coil 103, whereby, in the MRI apparatus 100 of this embodiment, it is possible to improve sensitivity of the RF coil 103 in the deep portion of the subject. The antenna device 200 is used as the RF coil 103, whereby, in the MRI apparatus of this embodiment, it is possible to eliminate performance deterioration by magnetic field coupling, to perform control by a multichannel configuration to homogenize the spatial distribution of the RF magnetic field, and to increase the imaging speed using the multichannel antenna.

In particular, according to the antenna device 200 of this embodiment, since the width $w_2$ of each of the electric field conductors 222 in the minor axis direction of the rung conductor 221 is greater than the width $w_1$ of the rung conductor 221, and the electric field conductors 222 of the adjacent channels are brought close to each other, it is possible to more effectively generate electric field coupling which suppresses magnetic field coupling.

According to the antenna device 200 of this embodiment, the area $S_2$ of each of the electric field conductor 222 has a size enough to generate an electric field for suppressing a shielding current, it is possible to effectively suppress a shielding current, and to allow the RF magnetic field to penetrate into the subject 112 deeply.

An electric field is generated in the end portion of a rung conductor of a TEM type antenna of the related art. However, in the TEM type antenna of the related art, there is no change in the width of the conductor between the center portion and the end portion of the rung conductor. Accordingly, even when the same voltage as the antenna device 200 of this embodiment is provided, since the effective area of the end portion of the rung conductor is small, it is not possible to effectively provide an electric field to a subject.

In bird cage type antennas, a bird cage antenna in which a ring conductor is connected to both ends of a rung conductor and the ring conductor portion has a width wider than the rung conductor portion is known. However, the bird cage type ring conductor is connected so as to build a loop once in a cylindrical shape, and the voltage does not necessarily increase in the end portion of the rung conductor. For this reason, the magnitude of an electric field which is provided by the end portion of the rung conductor is limited. Accordingly, the same effects as the antenna device 200 of this embodiment are not obtained. In the bird cage type antenna, it is difficult to configure separate channels of two or more channels.

According to the antenna device 200 of this embodiment, one connection terminal 224 is provided for one channel, and the function as an antenna and the suppression of a shielding current by the electric field conductors 222 are realized by a voltage supplied through the connection terminal 224.

Accordingly, with the antenna device 200 of this embodiment, it is possible to configure the RF coil 103 which allows a plurality of channels to be arranged and can improve penetration of the RF magnetic field into the human body with simple configuration. That is, according to this embodiment, it is possible to realize the high-performance RF coil 103 with simple configuration.

As a method which adjusts the resonance frequency of the antenna device 200, in addition to a method which changes the value of each of the frequency adjustment capacitors 223, a method which changes the capacitance of the capacitor by the electric field conductors 222 and the sheet-like conductor 210 is known. The capacitance of the capacitor by the electric field conductors 222 and the sheet-like conductor 210 can be changed by changing the area of each of the electric field conductors 222 or by putting a dielectric between each of the electric field conductors 222 and the sheet-like conductor 210. Specifically, the area of each of the electric field conductors 222 can be increased or decreased by cutting the end portion of each of the electric field conductors 222 or by attaching a copper plate to the end portion. The capacitance of the capacitor can be increased by putting a Teflon (Registered Trademark) plate or the like as a dielectric between the sheet-like conductor 210 and each of the electric field conductors 222.

In this embodiment, as shown in FIG. 2, although the connection terminal 224 which is the connection point of the end portion of the coaxial cable 230 and the antenna device 200 is provided near one end portion of the rung conductor 221, the position at which the connection terminal 224 is provided is not limited thereto. For example, the position may be the central portion of the rung conductor 221. In this case, a gap is provided in the central portion of the rung conductor 221, and the coaxial cable 230 is connected to both ends of the gap. For example, the coaxial cable 230 may be connected to both the end portion of each of the electric field conductors 222 and the sheet-like conductor 210.

In this embodiment, although the antenna device 200 is used as the RF coil 103 for both transmission and reception, the antenna device 200 may be used as an RF coil for only transmission or only reception. In this case, in the RF coil 103 (antenna device 200), a function called a detuning is required. The detuning is a function of shifting the resonance frequency in order to prevent interference with other antenna devices 200.

Figure 6:
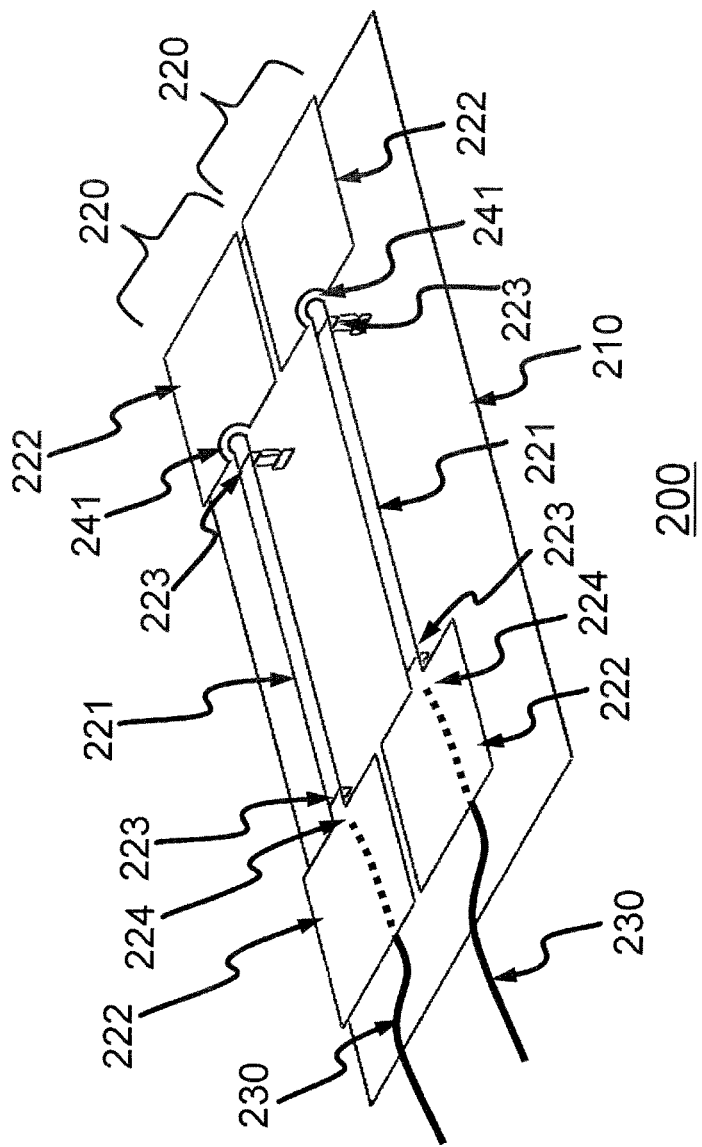
FIG. 6 is a perspective view of a modification example of the antenna device of the first embodiment.

In this case, for example, as shown in FIG. 6, the antenna device 200 provides a gap 241 between the rung conductor 221 and one electric field conductor 222. Then, a diode (not shown) is connected in the gap 241. If this configuration is made, a current flows in the diode, and in a state where the rung conductor 221 and the electric field conductors 222 are connected together, the antenna device 200 performs a normal operation as an antenna. In a state where the current of the diode is cut off and the rung conductor 221 and the electric field conductors 222 are disconnected from each other, in the antenna device 200, since a capacitor component which is formed between the electric field conductor 222 on the disconnected side and the sheet-like conductor 210 does not contribute to resonance, the resonance frequency is shifted and detuning is performed.

In the foregoing embodiment, although reduction of coupling is realized by arranging the electric field conductors 222 of the adjacent channels close to each other, the invention is not limited thereto. For example, a capacitor having capacitance of several pF may be connected between two adjacent electric field conductors 222, thereby realizing suppression of coupling. A method which connects the conductors of two adjacent antennas with the capacitor to cut interference between two antennas is known as the related art.

In this embodiment, although the antenna unit 220 including one rung conductor 221 for a pair of electric field conductors 222 has been described as an example, the number of rung conductors 221 is not limited thereto. For example, as shown in FIG. 7, the antenna unit 220 may include a plurality of rung conductors 221.

Figure 7:
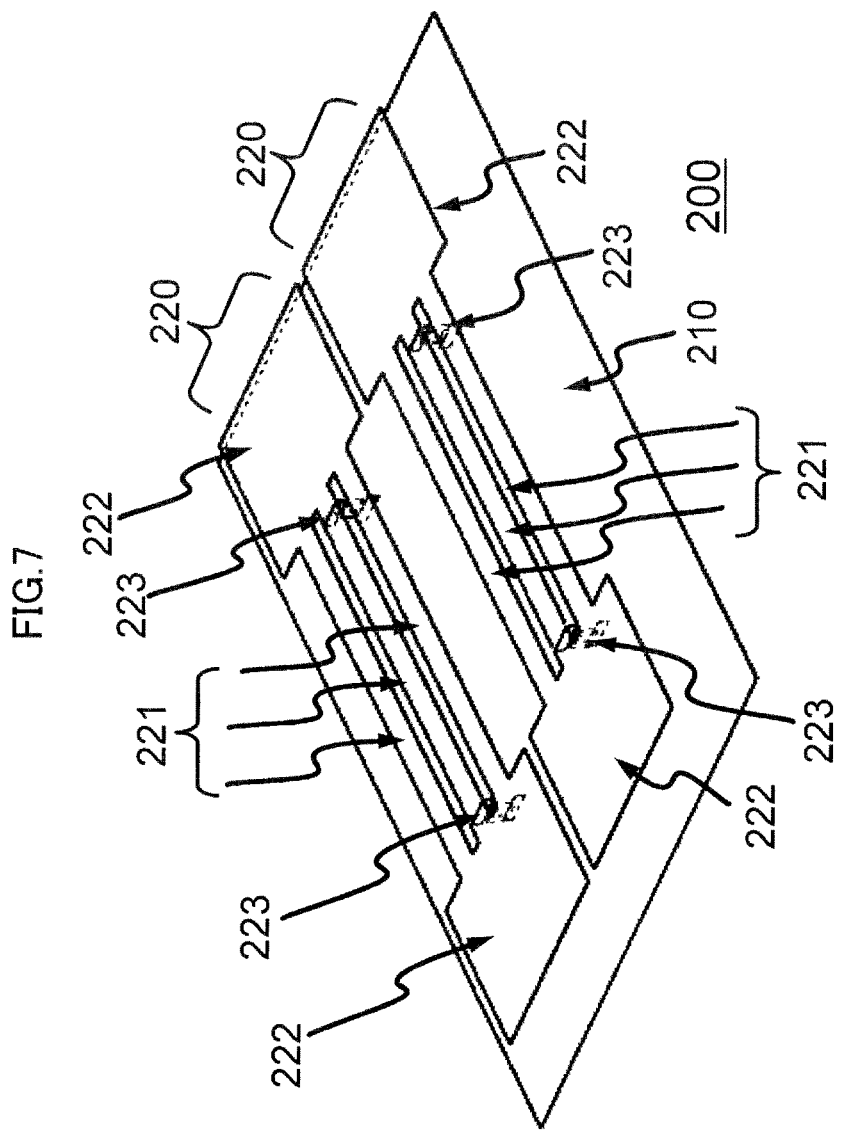
FIG. 7 is a perspective view of a modification example of the antenna device of the first embodiment.

FIG. 7 illustrates a state where two antenna units 220, in which a set of three rung conductors 221 is connected to a pair of electric field conductors 222, are arranged in a planar shape. Frequency adjustment capacitors 223 are provided at both ends of one rung conductor 221. In FIG. 7, although two capacitors 223 per channel are shown, six capacitors 223 may be provided in total at both ends of the three rung conductors 221. Here, a connection terminal 224 is not shown. However, one connection terminal 224 is arranged for each channel (antenna unit 220). The number of rung conductors 221 which connect the electric field conductors 222 is not limited thereto.

A pair of electric field conductors 222 are connected by a plurality of rung conductors 221, whereby it is possible to generate a magnetic field in a wider range and to realize wide antenna sensitivity.

In this embodiment, although the two-channel antenna device 200 including the two antenna units 220 has been described as an example, the number of antenna units 220 (channels) is not limited thereto.

Regardless of the number of antenna units 220 (channels), as in this embodiment, the rung conductor 221 of each antenna unit 220 is arranged substantially in parallel with the rung conductor 221 of the adjacent antenna unit, and the electric field conductors 222 of each antenna unit 220 are arranged so as to be close to the electric field conductors 222 of the adjacent antenna unit.

<<Second Embodiment>>

Next, a second embodiment to which the invention is applied will be described. In the RF coil of the first embodiment, the rung conductor 221 and the electric field conductors 222 are electrically connected together. In this embodiment, a rung conductor 221 and electric field conductors 222 are electrically disconnected from each other.

An MRI apparatus 100 of this embodiment basically has the same configuration as in the first embodiment. However, as described above, an antenna device which is used as the RF coil 103 has a different configuration. Hereinafter, this embodiment will be described focusing on an antenna device different from the first embodiment.

Figure 8:
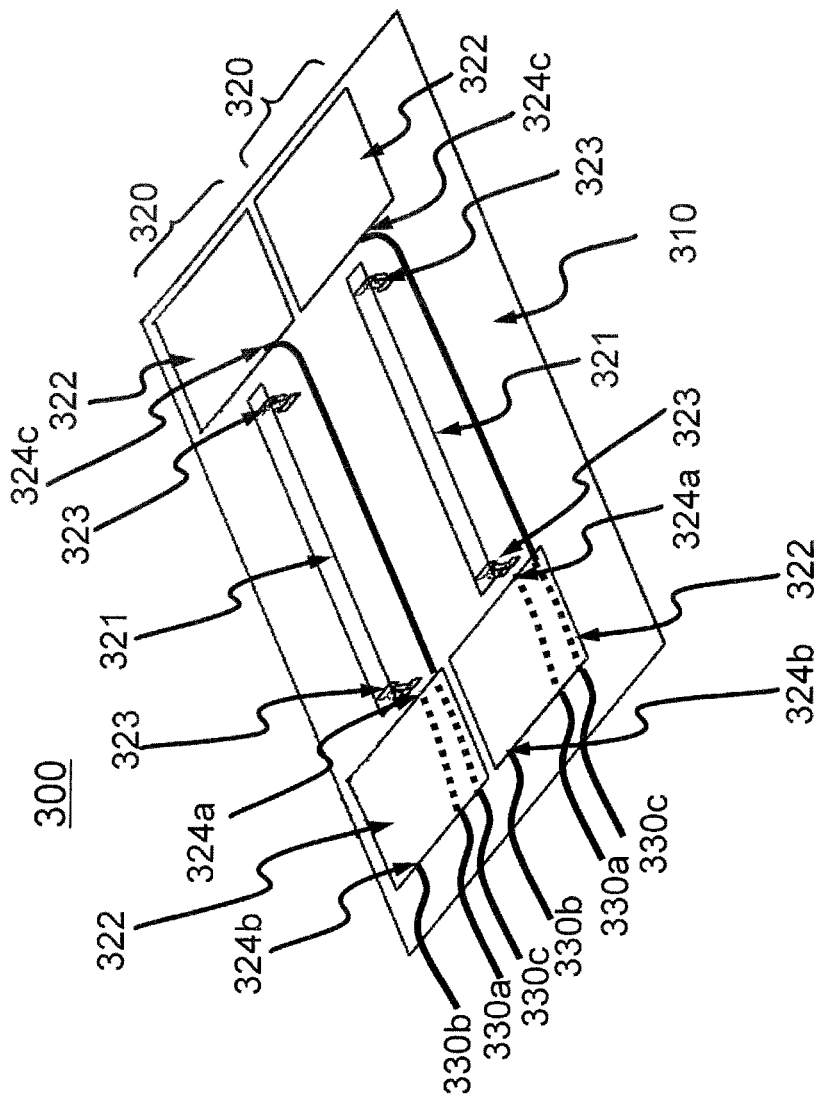
FIG. 8 is a perspective view of an antenna device of a second embodiment.

FIG. 8 is a diagram illustrating an antenna device 300 of the second embodiment. As in the first embodiment, the antenna device 300 of this embodiment includes a sheet-like conductor 310 and an antenna unit 320. The antenna unit 320 includes a rung conductor 321, electric field conductors 322, frequency adjustment capacitors 323, and connection terminals 324. These have the same functions as those with the same names in the first embodiment. The configuration and arrangement of each unit are basically the same as in the first embodiment.

However, the antenna unit 320 of this embodiment separately includes a rung conductor 321 and two electric field conductors 322. That is, in the antenna unit 320 of this embodiment, as shown in FIG. 8, the rung conductor 321 and the electric field conductors 322 are electrically disconnected from each other.

In this embodiment, the rung conductor 321 and the electric field conductors 322 are arranged on the sheet-like conductor 310 at a predetermined distance from the sheet-like conductor 310. The horizontal width of each of the electric field conductors 322 is greater than the horizontal width of the rung conductor 321. It is preferable that the area of each of the electric field conductor 322 is greater than the area of the rung conductor 321. The rung conductors 321 of the adjacent antenna unit 320 are arranged in parallel with each other. The electric field conductors 322 of the adjacent antenna units (channels) are arranged sufficiently close to each other so as to suppress coupling. As in the first embodiment, the respective arrangements are realized by a conductor support structure (not shown).

The frequency adjustment capacitors 323 are respectively connected to both ends of the rung conductor 321, and are connected to the sheet-like conductor 310. The rung conductor 321, the frequency adjustment capacitors 323, and the sheet-like conductor 310 form a loop-like circuit. Accordingly, a circuit which is formed by the two frequency adjustment capacitors 323, the rung conductor 321, and the sheet-like conductor 310 functions as a one-channel antenna. At this time, the frequency adjustment capacitors 323 are adjusted such that the antenna device 300 resonates at the frequency to be used in the MRI apparatus 100. Accordingly, the antenna device 300 of this embodiment functions as the RF coil 103 of the MRI apparatus 100. In FIG. 8, the two-channel antenna device 300 which has two antenna units 320 sharing one sheet-like conductor 310 is illustrated.

In the antenna device 300 of this embodiment, the connection terminals 324 corresponding to the total number of the rung conductor 221 and the electric field conductors 222 are arranged in each antenna unit 320. For example, in this embodiment, one rung conductor 221 and two electric field conductors 222 are arranged. Accordingly, three connection terminals 324 (324a, 324b, 324c) are arranged in one antenna unit 320.

For example, in the antenna device 300 of this embodiment, one connection terminal 324a is provided on one end portion of the rung conductor 321 and the directly beneath sheet-like conductor 310. That is, a center conductor of a coaxial cable 330a which connects the apparatus body of the MRI apparatus 100 and the antenna device 300 is connected to the rung conductor 321 side of the connection terminal 324a, and an external conductor of the coaxial cable 330a is connected to the sheet-like conductor 310 side. The remaining two connection terminals 324b and 324c are provided on the two electric field conductors 322 and the sheet-like conductor 210, and are connected to the MRI apparatus 100 by coaxial cables 330b and 330c.

In this embodiment, since this configuration is made, a voltage is provided to the respective electric field conductors 322 through the connection terminals 324b and 324c provided on the respective electric field conductors 322. Accordingly, in the antenna device 300 of this embodiment, it is possible to separately control a current which flows in the rung conductor 321 and a voltage which is provided to the electric field conductors 322.

The coaxial cables 330a, 330b, and 330c which are respectively connected to the connection terminals 324a, 324b, and 324c may be put together along the sheet-like conductor 310. For example, in FIG. 8, a case where the coaxial cable 330c connected to the connection terminal 324c is wired up to the connection terminal 324a along the sheet-like conductor 310, and is wired along with the coaxial cable 330a connected to the connection terminal 324a is illustrated. With this configuration, wiring to the antenna device 300 is facilitated.

Here, when the antenna device 300 of this embodiment is used as the transmission antenna of the RF coil 103, the phase of a voltage provided to each of the three connection terminals 324a, 324b, and 324c will be described. In this embodiment, as in the first embodiment, an electric field having a polarity is generated in the electric field conductors 322, thus, a shielding current on the surface of the subject 112 is cancelled by a reverse current flowing on the surface of the subject 112, and penetration of the magnetic field by a current flowing in the rung conductor 321 is improved.

In order to generate an electric field which makes a current flow enough to cancel a shielding current on the surface of the subject 112, power is fed in the same phase to the connection terminal 324a of the rung conductor 221 and the connection terminal (in the example of FIG. 8, 324b) of the electric field conductor 222 connected to the side on which the connection terminal 324a of the rung conductor 221 is arranged. It is preferable that power is fed in a phase (opposite phase) different at 180 degrees from the phase of the power fed to the connection terminals 324a and 324b to the connection terminal (in the example of FIG. 8, 324c) of the electric field conductor 222 connected to the side on which the connection terminal 324a of the rung conductor 221 is not arranged.

Power is supplied in the above-described manner, whereby a voltage in the same phase as the antenna device 200 of the first embodiment can be supplied to both electric field conductors 322. Accordingly, as in the first embodiment, the antenna device 300 of this embodiment generates an electric field which makes a current flow in a direction in which a shielding current is cancelled.

Figure 9:
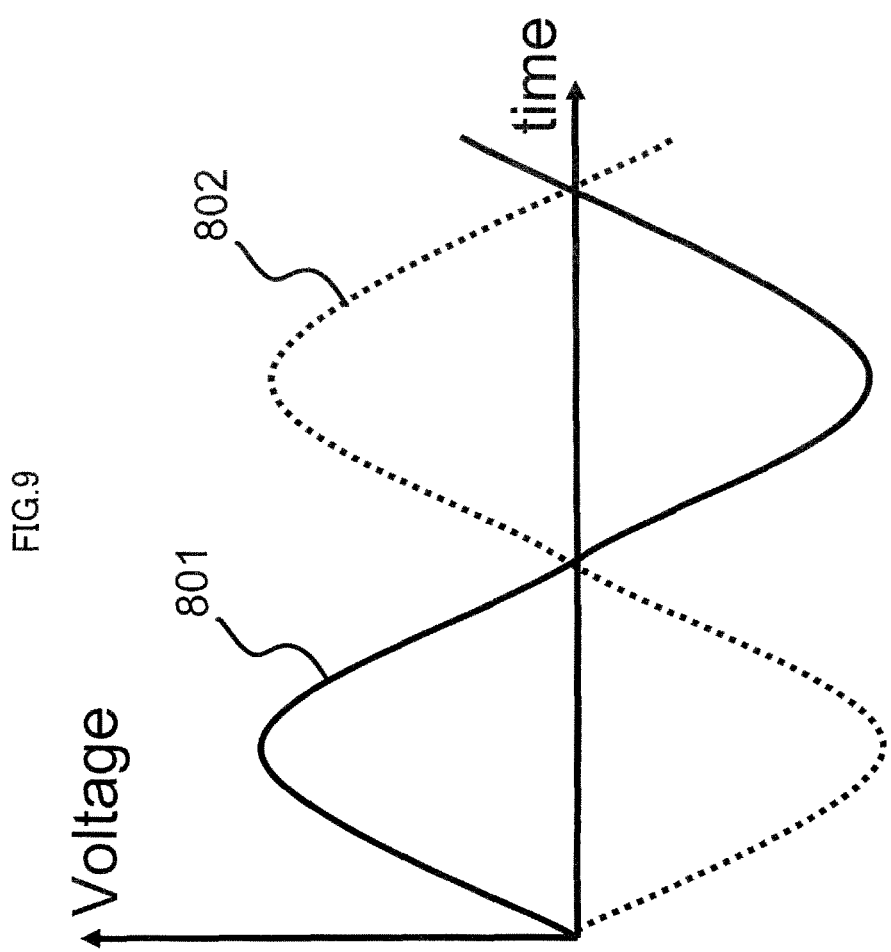
FIG. 9 is a graph of a voltage which is provided to each connection terminal of the antenna device of the second embodiment.

FIG. 9 shows a specific example of a voltage which is provided to each feed point (connection terminal 324). In FIG. 9, the horizontal axis represents times, and the vertical axis represents voltage. As shown in this drawing, a solid-line voltage 801 of a sinusoidal waveform is provided to the connection terminals 324a and 324b, and a dotted-line voltage 802 of a sinusoidal waveform in a phase different at 180 degrees from the voltage provided to the connection terminals 324a and 324b is provided to the connection terminal 324c.

As a method which changes the waveform of the voltage supplied to the connection terminal 324c at 180 degrees from the waveform of the voltage supplied to the other two connection terminals 324a and 324b, the following method is known. An output from one power amplifier is divided into three outputs in the same phase. These are respectively supplied to the connection terminals 324a, 324b, and 324c. At this time, in regard to the length of each of the coaxial cables 330a, 330b, and 330c for power feed, the coaxial cables 330a and 330b have the same length, and the coaxial cable 330c is longer or shorter by half wavelength of the frequency to be used. With this configuration, the phase which enters the connection terminal 324c can be shifted at 180 degrees.

In the antenna device 300 of this embodiment, as in the first embodiment, in order to effectively suppress coupling between channels, arrangement is made such that the horizontal width $w_2$ of each of the electric field conductor 322 is greater than the horizontal width $w_1$ of the rung conductor 321, and the interval between the electric field conductors 222 of the adjacent antenna units 220 is narrower than the interval between the rung conductors 221.

Similarly, the area of each of the electric field conductor 322 has a size enough to generate an electric field for suppressing an eddy current on the surface of the subject 112. In the first embodiment, a voltage generated in each of the frequency adjustment capacitors 223 is transmitted to each of the electric field conductors 222, and a voltage is provided to each of the electric field conductors 222. Accordingly, there is a limit to the voltage which is provided to each of the electric field conductors 222, and in order to generate a necessary electric field, adjustment is made with the area of each of the electric field conductors 222. As described above, in this embodiment, the voltage which is provided to each of the electric field conductors 322 can be controlled separately from the current which is provided to the rung conductor 321. Therefore, an electric field to be generated can be adjusted by adjusting the magnitude of the voltage. For this reason, the degree of freedom of the area of each of the electric field conductor 322 is large compared to the first embodiment.

As described above, the MRI apparatus of this embodiment includes the magnet 101 which generates a magnetostatic field and forms a magnetostatic field, and the RF coil 103 which performs at least one of transmission of a high-frequency signal to the magnetostatic field and reception of a nuclear magnetic resonance signal generated from the subject 112 placed in the magnetostatic field, in which the RF coil 103 includes the sheet-like conductor 310 and the antenna unit 320, the antenna unit 320 includes the rung conductor 321 which is arranged at a predetermined distance from the sheet-like conductor 310, and the two electric field conductors 322 which are arranged in both end portions of the rung conductor 321 at a predetermined distance from the sheet-like conductor 310, and the rung conductor 321 and the sheet-like conductor 310 configure a loop circuit which resonates at the frequency of the high-frequency signal transmitted from the RF coil 103 or the nuclear magnetic resonance signal received by the RF coil 103.

The electric field conductors 322 generate an electric field for suppressing a shielding current flowing on the surface of the subject 112 by a magnetic field produced by a current flowing in the rung conductor 321. The RF coil 103 is a multichannel antenna including a plurality of antenna units 320, and the electric field conductors 322 of each antenna unit 320 cause the electric field conductors 322 of the adjacent antenna unit 320 to generate a voltage for suppressing magnetic field coupling between the rung conductors 321 of the adjacent antenna units 320.

The two frequency adjustment capacitors 323 which connect both end portions of the rung conductor 321 and the sheet-like conductor 310 substantially directly beneath the rung conductor 321 are further provided, and the value of each of the frequency adjustment capacitors 323 is adjusted such that the loop circuit resonates at the frequency of the high-frequency signal or the nuclear magnetic resonance signal. The rung conductor 321 and the electric field conductors 322 are electrically disconnected from each other, a voltage is provided to the electric field conductors 322 separately from the rung conductor 321, and the voltage has magnitude to generate the electric field.

The interval between the electric field conductors 322 of the adjacent antenna units 320 may be narrower than the interval between the rung conductors 321 of the adjacent antenna units 320.

That is, according to this embodiment, as in the first embodiment, the electric field conductors 322 having a predetermined area are provided at both ends of the rung conductor 321 as a constituent element of an antenna, which transmits and receives electromagnetic waves. The electric field conductors 322 are provided, whereby the antenna device 300 of this embodiment can reduce a coupling current between adjacent channels, can suppress a shielding current on the surface of the subject 112, and can improve penetration of the RF magnetic field into the subject.

The antenna device 300 is used as the RF coil 103, whereby, in the MRI apparatus 100 of this embodiment, it is possible to improve sensitivity of the RF coil 103 in the deep portion of the subject. The antenna device 300 is used as the RF coil 103, whereby, in the MRI apparatus of this embodiment, it is possible to eliminate performance deterioration by magnetic field coupling, and to perform control by a multichannel configuration to homogenize the spatial distribution of the RF magnetic field.

In the antenna device 300 of this embodiment, the rung conductor 321 and the electric field conductors 322 are electrically disconnected from each other. Accordingly, it is possible to control the voltage which is provided to the electric field conductors 322 separately from the rung conductor 321 which transmits and receives electromagnetic waves, and to optimally control transmission and reception of electromagnetic waves and suppression of a shielding current.

Since the voltage which is provided to the electric field conductors 322 can be controlled separately, there is no limit to the size of the electric field conductors 322 by electric field generation, and it is possible to form the electric field conductors 322 with a high degree of freedom.

In this embodiment, as in the first embodiment, various modifications may be made. The position of the connection terminal 324a with respect to the rung conductor 321 is not considered. However, when the position of the connection terminal 324a is different from FIG. 8, the relationship between the phases of the voltage waveforms which are provided to the respective terminals is not a simple relationship of a reversed phase at 180 degrees shown in FIG. 9. Either transmission or reception may be realized. In this case, a part of the rung conductor 321 which configures a loop circuit is cut and a diode is connected, thereby realizing detuning. In order to reduce coupling, a capacitor having capacitance of several pF may be connected between two adjacent rung conductors 321. A plurality of rung conductors 321 (not shown) which have both end portions connected between adjacent rung conductors 321 may be provided for a pair of electric field conductors 322.

When a plurality of rung conductors 321 are provided for a pair of electric field conductors 322, the connection terminals are respectively provided on the rung conductors 321 and a pair of electric field conductors 322.

in this embodiment, as in the first embodiment, although the two-channel antenna device 300 including the two antenna units 320 has been described as an example, the number of channels is not limited thereto.

<<Third Embodiment>>

Next, a third embodiment to which the invention is applied will be described. In this embodiment, a sheet-like conductor has a cylindrical shape or an elliptic cylindrical shape, and a plurality of antenna units which configure one channel are arranged inside the sheet-like conductor.

Figure 10:
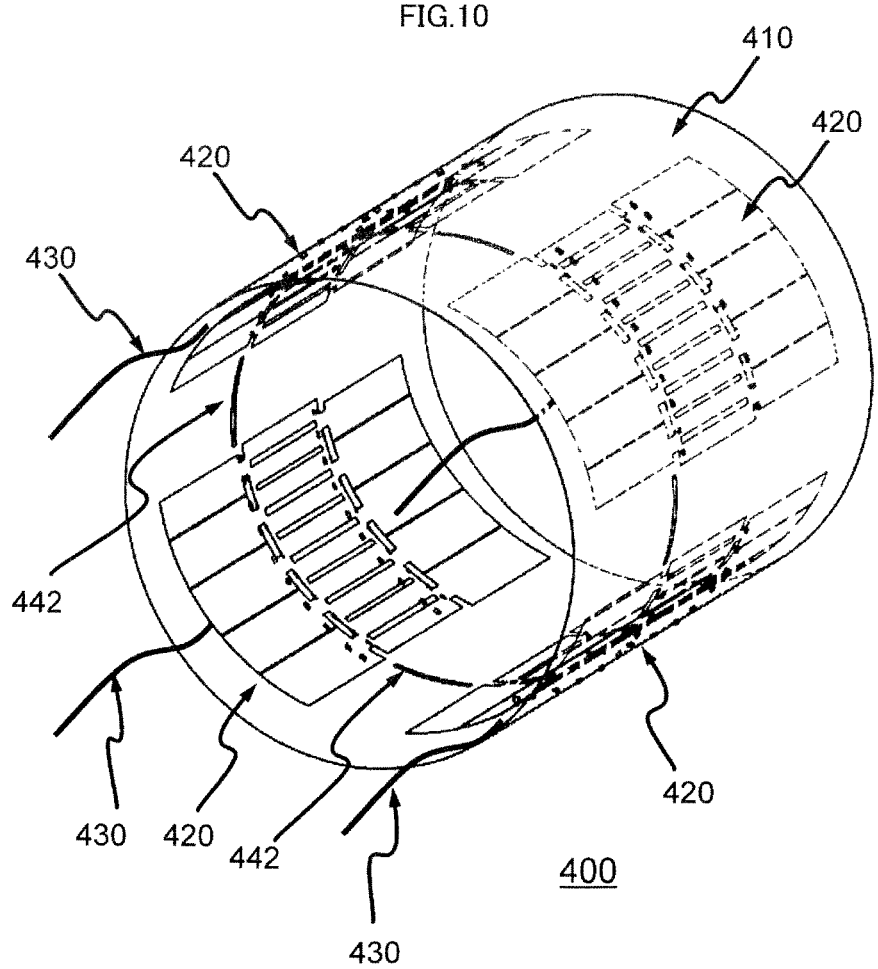
FIG. 10 is a perspective view of en antenna device of a third embodiment.

An MRI apparatus 100 of this embodiment basically has the same configuration as in the first embodiment. However, as described above, an antenna device which is used as the RF coil 103 has a different configuration. As shown in FIG. 10, an antenna device 400 of this embodiment has a tubular shape as a whole. Accordingly, it is assumed that the MRI apparatus 100 of this embodiment is of a horizontal magnetic field type having a cylindrical bore. Hereinafter, this embodiment will be described referring to FIGS. 10 and 11 focusing on an antenna device different from the first embodiment.

FIG. 10 is an appearance diagram of the antenna device 400 of this embodiment. Here, as an example, a case where four antenna units 420 are provided inside the cylindrical sheet-like conductor 410 on the upper right, lower right, lower left, and upper left when viewed from one opening of the cylinder and configured as a four-channel antenna will be described.

As shown in this drawing, as in the first embodiment, the antenna device 400 of this embodiment includes a sheet-like conductor 410 and an antenna unit 420. The antenna unit 420 includes rung conductors 421, electric field conductors 422, frequency adjustment capacitors, and connection terminals. In this drawing, for simplification of description, the frequency adjustment capacitors and the connection terminals are not shown.

Figure 11:
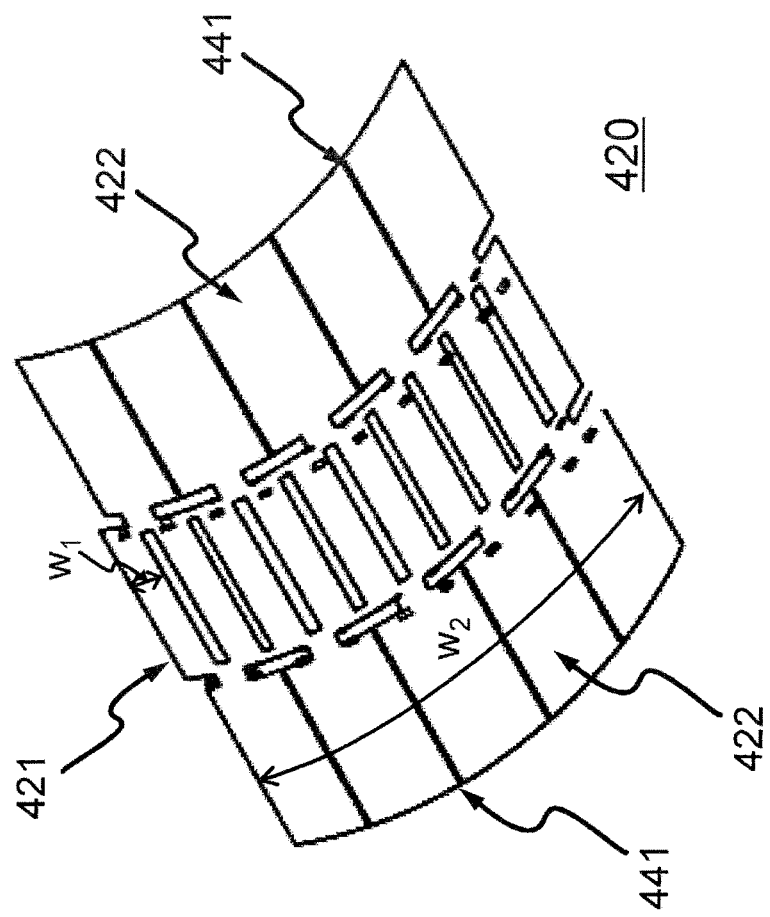
FIG. 11 is a perspective view of an antenna unit of the antenna device of the third embodiment.

As in the first embodiment, a coaxial cable is connected to the connection terminals. The antenna device 400 is connected to the MRI apparatus 100 through the coaxial cable. FIG. 11 is a diagram showing a state where the rung conductors 421 and the electric field conductors 422 of the antenna unit 420 of this embodiment are extracted.

As described above, in the sheet-like conductor 410 of this embodiment, the planar sheet-like conductor in the first and second embodiments is modified to a cylindrical shape. Four sets of four-channel antenna units 420 are arranged inside the cylindrical sheet-like conductor 410. In this embodiment, one antenna unit 420 configures one channel.

As shown in FIG. 11, each antenna unit 420 includes a pair of electric field conductors 422 and a plurality of rung conductors 421. Each rung conductor 421 is arranged in parallel between a pair of electric field conductors 422. In FIG. 11, a case where the number of rung conductors 421 is ten is illustrated.

As described above, a pair of electric field conductors 422 are connected by a plurality of rung conductors 421, whereby it is possible to generate a magnetic field in a wider range in the circumferential direction inside the cylinder, and to realize a wide antenna sensitive region.

In the antenna device 400 of this embodiment, the horizontal width $w_2$ of each of the electric field conductors 422 in the circumferential direction of the antenna device 400 is greater than the width $w_1$ of one rung conductor 421. Accordingly, the area of each of the electric field conductor 422 increases to generate an electric field which makes a current flow so as to cancel a shielding current.

As in the first embodiment, the rung conductors 421 and the electric field conductors 422 are arranged at a predetermined distance from the sheet-like conductor 410. For example, when the sheet-like conductor 410 has a cylindrical shape, arrangement is made on a virtual cylinder coaxial with the sheet-like conductor 410. When the sheet-like conductor 410 has an elliptic cylindrical shape, arrangement is made on a virtual elliptic cylinder coaxial with the sheet-like conductor 410. The arrangement on the virtual cylinder or the virtual elliptic cylinder is realized by a conductor support structure (not shown).

Figure 12:
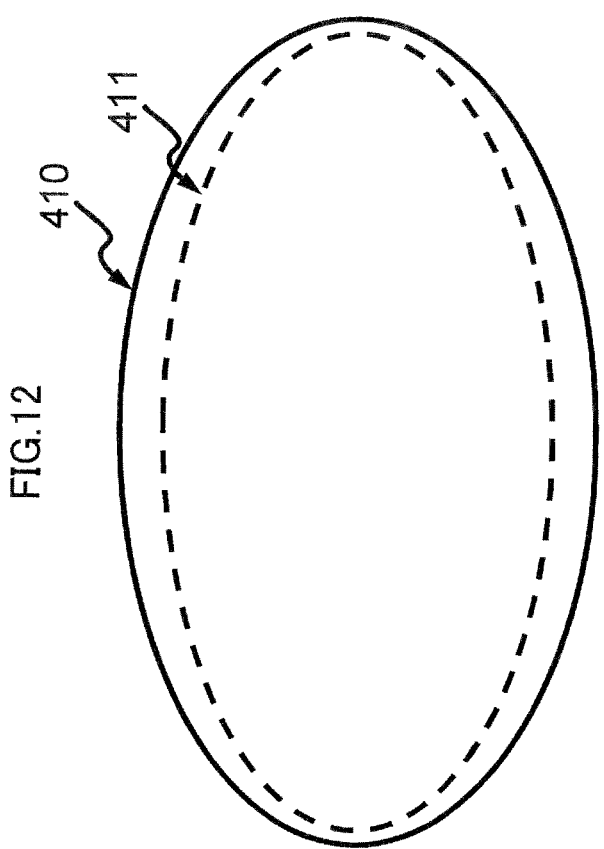
FIG. 12 is an explanatory view illustrating the arrangement of antenna units of the third embodiment.

When the sheet-like conductor 410 has an elliptic cylindrical shape, arrangement is made on the sheet-like conductor 410 and a virtual elliptic cylinder having a different flatness ratio or a virtual curve having a different shape. In this case, for example, as shown in FIG. 12, the conductors may be arranged on a virtual elliptic cylinder 411 or a virtual curve with a decreasing distance from the sheet-like conductor 410 along the major axis radial direction of the ellipse of the section of the sheet-like conductor 410.

For example, if the diameter of the cylindrical sheet-like conductor 410 is 600 millimeters, it is possible to configure the antenna device 400 inside which the human is provided to perform imaging. If the diameter of the cylindrical sheet-like conductor 410 is about 270 millimeters, it is possible to configure the antenna device 400 in which the head of the human is provided to perform imaging.

In this way, when a four-channel antenna is configured inside a cylinder or an elliptic cylinder, it is possible to optimize an irradiation RF which is provided to the subject 112 by changing the amplitude and phase of an RF waveform be transmitted through each channel. This method is called RF shimming or parallel RF irradiation. These methods are applied to the antenna device 400 of this embodiment, thereby reducing inhomogeneity of the irradiation RF which is conspicuous in a high-magnetic field MRI apparatus equal to or greater than 3 tesla.

As described above, the MRI apparatus of this embodiment includes the magnet 101 which generates a magnetostatic field and forms a magnetostatic field, and the RF coil 103 which performs at least one of transmission of a high-frequency signal to the magnetostatic field and reception of a nuclear magnetic resonance signal generated from the subject 112 placed inside the magnetostatic field, in which the RF coil 103 includes the sheet-like conductor 410 and the antenna unit 420, the antenna unit 420 includes the rung conductors 421 which are arranged at a predetermined distance from the sheet-like conductor 410, and the two electric field conductors 422 which are arranged in both end portions of the rung conductors 421 at a predetermined distance from the sheet-like conductor 410, and the rung conductors 421 and the sheet-like conductor 410 configure a loop circuit which resonates at the frequency of the high-frequency signal transmitted from the RF coil 103 or the nuclear magnetic resonance signal received by the RF coil 103.

The electric field conductors 422 generate an electric field for suppressing a shielding current flowing on the surface of the subject 112 by a magnetic field produced by a current flowing in the rung conductors 421. The RF coil 103 is a multichannel antenna including a plurality of antenna units 420, and the electric field conductors 422 of each antenna unit 420 cause the electric field conductors 422 of the adjacent antenna unit 420 to generate a voltage for suppressing magnetic field coupling between the rung conductors 421 of the adjacent antenna units 420.

The two frequency adjustment capacitors which connect both end portions of the rung conductors 421 and the sheet-like conductor 410 substantially directly beneath the rung conductors 421 are further provided, and the value of each of the frequency adjustment capacitors is adjusted such that the loop circuit resonates at the frequency of the high-frequency signal or the nuclear magnetic resonance signal.

A plurality of antenna units 420 are provided, each antenna unit 420 includes connection terminals which connect the RF coil 103 to the MRI apparatus 100, the connection terminals are connected to the rung conductors 421 and the sheet-like conductor 410, the sheet-like conductor 410 has a tubular shape, and the phase and amplitude of the voltage supplied to each antenna unit 420 through the connection terminals are controlled separately such that the high-frequency signal transmitted from the RF coil 103 is optimized.

The sheet-like conductor 410 may have an elliptic cylindrical shape. The antenna unit 420 may be arranged on a virtual curve with a decreasing distance from the sheet-like conductor along the major axis radial direction of the section of the elliptic cylinder. The width of each of the electric field conductors 422 in the minor axis direction of the rung conductor 421 may be wider than the width of each of the rung conductor 421.

That is, as in the first embodiment, the antenna device 400 of this embodiment includes the electric field conductors 422 having a predetermined area at both ends of the rung conductors 421 as a constituent element of an antenna which transmits and receives electromagnetic waves. The electric field conductors 422 are provided, whereby the antenna device 400 of this embodiment can reduce a coupling current between adjacent channels, can suppress a shielding current on the surface of the subject 112, and can improve penetration of the RF magnetic field into the subject.

The antenna device 400 is used as the RF coil 103, whereby, in the MRI apparatus 100 of this embodiment, it is possible to improve sensitivity of the RF coil 103 in the deep portion of the subject. The antenna device 400 is used as the RF coil 103, whereby, in the MRI apparatus of this embodiment, it is possible to eliminate performance deterioration by magnetic field coupling, and to perform control by a multichannel configuration to homogenize the spatial distribution of the RF magnetic field.

In particular, according to the antenna device 400 of this embodiment, as shown in FIG. 10, if the four antenna units 420 having a plurality of rung conductors 421 are arranged and configured as a four-channel antenna, the four-channel antenna is suitable as a transmission and reception antenna of a trunk in the MRI apparatus 100 equal to or greater than 3 tesla in terms of the size and shape.

As shown in FIG. 11, each electric field conductor 422 may include slits 441. The slits 441 are put, whereby it is possible to reduce an eddy current on the surface of each of the electric field conductors 422 by a magnetic field generated by the gradient magnetic field coil 102. Accordingly, it is possible to reduce heat generation or adversely effects on images by an eddy current on the surface of each of the electric field conductors 422.

FIG. 11 illustrates a case where four slits 441 are put in one electric field conductor 422 and the electric field conductors 422 are divided into five partial conductors. Each partial conductor is connected to adjacent partial conductors by slit connection capacitors in both end portions of the slits 441. As the slit connection capacitors, a slit connection capacitor having hundreds to thousands of pF is used. The slit connection capacitors are adjusted such that the partial conductors are electrically disconnected in an AC magnetic field of several kHz to be used in the gradient magnetic field, and the partial conductors act as one wide electric field conductor 422 in an AC magnetic field equal to or greater than tens of MHz to be used as the RF coil 103. With this structure, possible to significantly reduce the effect of an eddy current of a gradient magnetic field.

As shown in FIG. 10, the antenna device 400 of this embodiment may include bridge conductors 442 which connect one end portion of the rung conductors 421 of the adjacent channels (antenna units 420). Both ends of each of the bridge conductors 442 and the end portion of the rung conductor 421 of the adjacent channel (antenna unit 420) are connected by coupling reduction capacitors. In the antenna device 400 of this embodiment, with this configuration, coupling between channels is further reduced. The bridge conductors 442 are used when coupling between channels is large and slight coupling remains in spite of providing the electric field conductors 422. For example, a coupling reduction capacitor of several pF is used for connection between the bridge conductors 442 and the rung conductors 421, whereby coupling between channels can be equal to or smaller than about −15 dB by the value of an S parameter.

A voltage across the electric field conductors 422 may increase to about several kV. In order to prevent corona discharge or the like at this time, processing for rounding the corner portion of the electric field conductors 422 and corona dope coating the end portion may be carried out.

In order to prevent creeping discharge, an air layer may be provided in the end portion of each of the electric field conductors 422. This is to reduce the contact surface of the conductor support structure and the electric field conductors 422.

In this embodiment, as in the first embodiment, although a configuration in which the electric field conductors and the rung conductors are electrically connected together has been described as an example, the invention is not limited thereto. As in the second embodiment, the electric field conductors and the rung conductors may be electrically disconnected from each other. In this case, as in the second embodiment, a connection terminal is provided on each of the rung conductors and a pair of electric field conductors, and a coaxial cable 430 is connected to the connection terminal.

As in the first embodiment, in order to adjust the resonance frequency, a configuration in which the capacitance of a capacitor by the electric field conductors 422 and the sheet-like conductor 410 is changed by the same method as in the first embodiment may be made. The positions of the connection terminals with respect to the rung conductors 421 are not considered. Either transmission or reception may be realized. In this case, as in the first embodiment, a gap is provided between each of the rung conductors 421 and each of the electric field conductors 422, a diode is connected in the gap, and detuning is realized. The number of rung conductors 421 between a pair of electric field conductors 422 may be one.

A configuration in which the slits 441 are put in the electric field conductors 422 and a configuration in which the bridge conductors 442 are arranged between the adjacent antenna units 420 (channels) and connection is made by the coupling reduction capacitors may be applied to other embodiments.

In this embodiment, although the four-channel antenna device 400 including the four antenna units 420 has been described as an example, the number of channels is not limited thereto.

<<Fourth Embodiment>>

Next, a fourth embodiment to which the invention is applied will be described. In an antenna device which is used as the RF coil of the MRI apparatus of this embodiment, a rung conductor can be manufactured to have a desired length.

An MRI apparatus 100 of this embodiment basically has the same configuration as in the first embodiment. However, as described above, an antenna device which is used as the RF coil 103 has a different configuration. Hereinafter, this embodiment will be described focusing on an antenna device different from the first embodiment.

Figure 13:
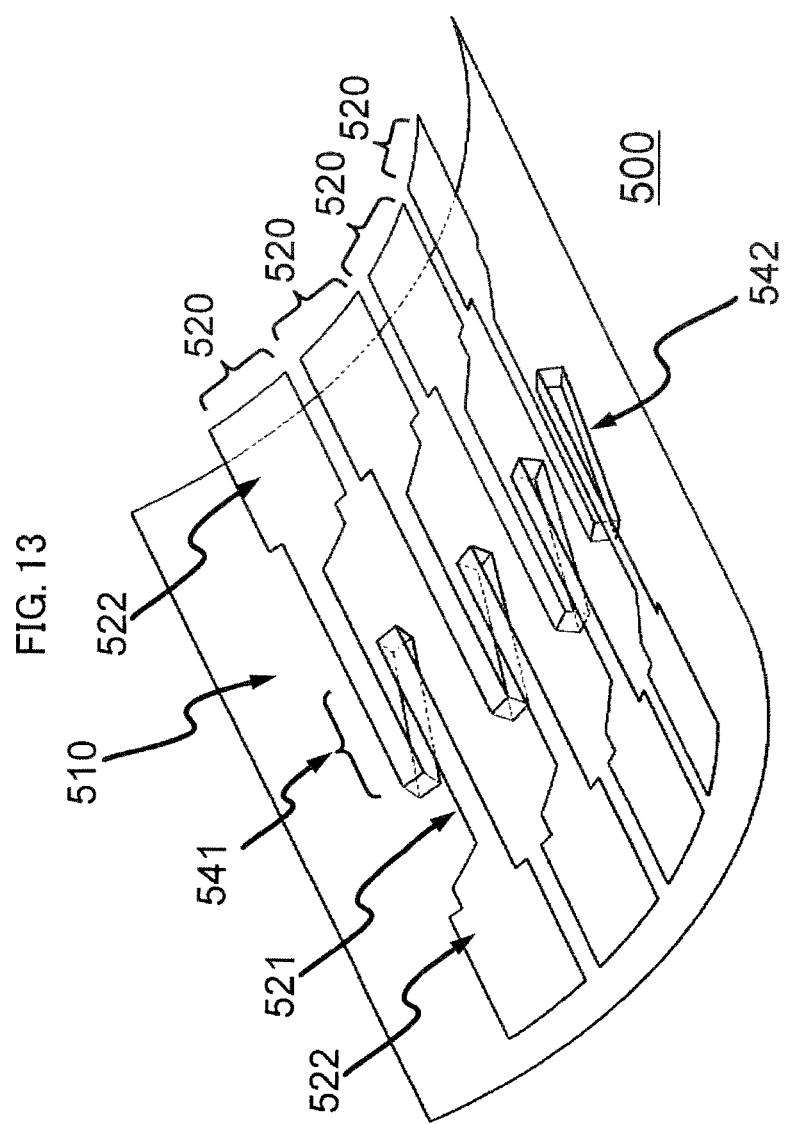
FIG. 13 is a perspective view of an antenna device of a fourth embodiment.

FIG. 13 is an appearance diagram of an antenna device 500 of this embodiment. As in the first embodiment, the antenna device 500 of this embodiment includes a sheet-like conductor 510 and an antenna unit 520. The antenna unit 520 includes a rung conductor 521, electric field conductors 522, frequency adjustment capacitors, and a connection terminal. Here, for simplification of description, the frequency adjustment capacitors and the connection terminal are not shown. Each configuration has the same function as the configuration with the same name in the first embodiment.

The frequency adjustment capacitors are connected to both ends of the rung conductor 521, and are connected to the sheet-like conductor 510. The rung conductor 521, the frequency adjustment capacitors, and the sheet-like conductor 510 form a loop-like circuit. Accordingly, a circuit which is formed by the two frequency adjustment capacitors, the rung conductor 521, and the sheet-like conductor 510 functions as a one-channel antenna. One connection terminal is provided for each channel. At this time, the frequency adjustment capacitors are adjusted such that the antenna device 500 resonates at the frequency to be used in the MRI apparatus 100. Accordingly, the antenna device 500 of this embodiment functions as the RF coil 103 of the MRI apparatus 100.

FIG. 13 shows a four-channel antenna device 500 having four antenna units 520 as an example. A case where a sheet-like conductor 510 has a shape in which a part of a cylindrical lateral surface is cut is illustrated.

As shown in FIG. 13, as in the first embodiment, the rung conductor 521 of this embodiment has a pair of electric field conductors 522 connected to both ends thereof. As in the first embodiment, the rung conductor 521 of this embodiment is formed of an elongated flat plate or tape-like, rod-like, or tubular conductor. However, the rung conductor 521 has a folded portion 541 in a part thereof.

FIG. 13 illustrates the rung conductor 521 with a folded portion 541 in which a tape-like conductor rotates once so as to build a loop. When tracing the rung conductor 521 from an end, the rung conductor 521 which advances in one direction is folded in the folded portion 541, advances in an opposite direction, is folded again, advances in the same direction as the initial direction, and reaches the other end. A portion 542 of the folded portion 541 which is folded once and advances reversely passes through a region near the sheet-like conductor 510 rather than other portions.

The rung conductor 521 of this embodiment is arranged such that the distance from the sheet-like conductor 510 is kept constant in each of the reversely advance portion 542 and other portions parallel to the sheet-like conductor 510. The rung conductor 521 is arranged so as not to be in contact with the sheet-like conductor 510. The electric field conductors 522 are arranged at the same distance from the sheet-like conductor 510 as the rung conductor 521 other than the reversely advance portion 542. As in the first embodiment, the arrangement is realized by a conductor support structure (not shown).

The shape of the folded portion 541 is called a spiral shape. When viewed from the side, since the folded portion 541 looks like a loop, this may be also called a loop shape.

The rung conductor 521 has a shape having the folded portion 541 shown in FIG. 13, whereby the effective length of the rung conductor 521 is extended. Accordingly, in this embodiment, a voltage across both end portions of the rung conductor 521 becomes higher than the rung conductor 521 having no folded portion 541.

In the rung conductor 521 of the embodiment, the effective length thereof can be adjusted by changing the length of the folded portion 541. The resonance frequency f of the antenna device 500 including the rung conductor 521, the effective inductance L of the rung conductor 521, and the capacitance C of the capacitor component by the antenna unit 520 and the sheet-like conductor 510 including the capacitance of each of the frequency adjustment capacitors have the relationship of $f=\alpha(L \times C)^{-1/2}$ (where $\alpha$ is a proportional constant). That is, the resonance frequency f is determined by the effective inductance L of the rung conductor 521 and the capacitance C of the capacitor component. Accordingly, it is possible to adjust the inductance L by adjusting the effective length of the rung conductor 521, and to adjust the capacitance of each of the frequency adjustment capacitors for allowing the antenna device 500 to have a desired resonance frequency.

For example, the effective length of the rung conductor 521 is extended, thereby decreasing the capacitance of each of the frequency adjustment capacitors necessary for resonance. A frequency adjustment capacitor is not required depending on the effective length of the rung conductor 521. When a frequency adjustment capacitor is not required, since soldering of a frequency adjustment capacitor to the sheet-like conductor 510 is not required, it is possible to freely move the antenna unit 520 on the sheet-like conductor 510, and to increase the degree of freedom of design.

In FIG. 13, although the number of folds of the folded portion 541 (the number of rotations of the spiral) is one, the number of times does not matter. A spiral rung conductor 521 which rotates multiple times, such as twice or three times, may be provided.

In the antenna device 500 of this embodiment, other features of the rung conductor 521 and the electric field conductors 522 are the same as those in the first embodiment. That is, the horizontal width $w_2$ of each of the electric field conductors 522 is greater than the horizontal width $w_1$ of the rung conductor 521. The area of each of the electric field conductors 522 has a size enough to generate an electric field for suppressing a shielding current. For example, it is preferable that the area of each of the electric field conductors 522 is greater than the area of the rung conductor 521. The rung conductors 521 of the adjacent antenna units 520 are basically arranged substantially in parallel with each other. The electric field conductors 522 of the adjacent antenna units (channels) are arranged sufficiently close to each other so as to suppress coupling.

As described above, the MRI apparatus of this embodiment includes the magnet 101 which generates a magnetostatic field and forms a magnetostatic field, and the RF coil 103 which performs at least one of transmission of a high-frequency signal to the magnetostatic field and reception of a nuclear magnetic resonance signal generated from the subject 112 placed inside the magnetostatic field, in which the RF coil 103 includes the sheet-like conductor 510 and the antenna unit 520, the antenna unit 520 includes the rung conductor 521 which is arranged at a predetermined distance from the sheet-like conductor 510, and the two electric field conductors 522 which are arranged in both end portions of the rung conductor 521 at a predetermined distance from the sheet-like conductor 510, and the rung conductor 521 and the sheet-like conductor 510 configure a loop circuit which resonates at the frequency of the high-frequency signal transmitted from the RF coil 103 or the nuclear magnetic resonance signal received by the RF coil 103.

The electric field conductors 522 generate an electric field for suppressing a shielding current flowing on the surface of the subject 112 by a magnetic field produced by a current flowing in the rung conductor 521. The RF coil 103 is a multichannel antenna including a plurality of antenna units 520, and the electric field conductors 522 of each antenna unit 520 cause the electric field conductors 522 of the adjacent antenna unit 520 to generate a voltage for suppressing magnetic field coupling between the rung conductors 521 of the adjacent antenna units 520.

The two frequency adjustment capacitors which connect both end portions of the rung conductor 521 and the sheet-like conductor 510 substantially directly beneath the rung conductor 521 are further provided, and the value of each of the frequency adjustment capacitors is adjusted such that the loop circuit resonates at the frequency of the high-frequency signal or the nuclear magnetic resonance signal.

The rung conductor 521 has a shape in which the length of the rung conductor 521 can be adjusted, and the length of the rung conductor 521 is adjusted such that the loop circuit resonates at the frequency of the high-frequency signal or the nuclear magnetic resonance signal. The rung conductor 521 may have a spiral shape.

The rung conductor 521 and the electric field conductors 522 may be electrically connected together. The interval between the electric field conductors 522 of the adjacent antenna units 520 may be narrower than the interval between the rung conductors 521 of the adjacent antenna units 520. The area of each of the electric field conductors 522 may be determined so as to generate the electric field.

That is, in this embodiment, the antenna device 500 which is used as the RF coil 103 includes the electric field conductors 522 having a predetermined area at both ends of the rung conductor 521 as a constituent element of an antenna which transmits and receives electromagnetic waves. The electric field conductors 522 are provided, whereby the antenna device 500 of this embodiment can reduce a coupling current between adjacent channels, can suppress a shielding current on the surface of the subject 112, and can improve penetration of the RF magnetic field into the subject.

The antenna device 500 is used as the RF coil 103, whereby, in the MRI apparatus 100 of this embodiment, it is possible to improve sensitivity of the RF coil 103 in the deep portion of the subject. The antenna device 500 is used as the RF coil 103, whereby, in the MRI apparatus of this embodiment, it is possible to eliminate performance deterioration by magnetic field coupling, and to perform control by a multichannel configuration to homogenize the spatial distribution of the RF magnetic field.

In particular, according to the antenna device 500 of this embodiment, since the width $w_2$ of each of the electric field conductors 522 in the minor axis direction of the rung conductor 521 is greater than the width $w_1$ of the rung conductor 521, and the electric field conductors 522 of the adjacent channels are close to each other, it is possible to more effectively generate electric field coupling which suppresses magnetic field coupling.

According to the antenna device 500 of this embodiment, since the area 32 of each of the electric field conductors 222 has a size enough to generate an electric field for suppressing a shielding current, it is possible to effectively suppress a shielding current, and to allow the RF magnetic field to penetrate into the subject 112 deeply.

According to the antenna device 500 of this embodiment, one connection terminal is provided for each channel, and the function as an antenna and suppression of a shielding current by the electric field conductors 522 are realized by a voltage supplied through the connection terminal.

According to this embodiment, it is possible to extend the length of the rung conductor 521. Accordingly, it is possible to reduce the capacitance of each of the frequency adjustment capacitors, and to obtain the above-described effects with simple configuration. Instead of extending the of the rung conductor 521, it is possible to adjust the rung conductor 521 to a desired length. Therefore, a frequency adjustment capacitor is not required, and it is possible to realize an antenna device having the same effects with simple configuration.

Therefore, with the antenna device 500 of this embodiment, it is possible to configure the RF coil 103 which allows a plurality of channels to be arranged and can improve penetration of the RF magnetic field into the human body with simple configuration. That is, according to this embodiment, it is possible to realize a high-performance antenna device with simple configuration.

In particular, the antenna device 500 of the embodiment is useful when a voltage which is provided to the electric field conductors 522 is desired to increase and frequency adjustment capacitors which connect the sheet-like conductor 510 and the rung conductor 521 are not provided.

A method which extends the effective length of the rung conductor 521 is not limited to a case where the folded portion 541 is provided. For example, as shown in FIG. 14, a conductor which forms the rung conductor 521 may be processed.

Figure 14:
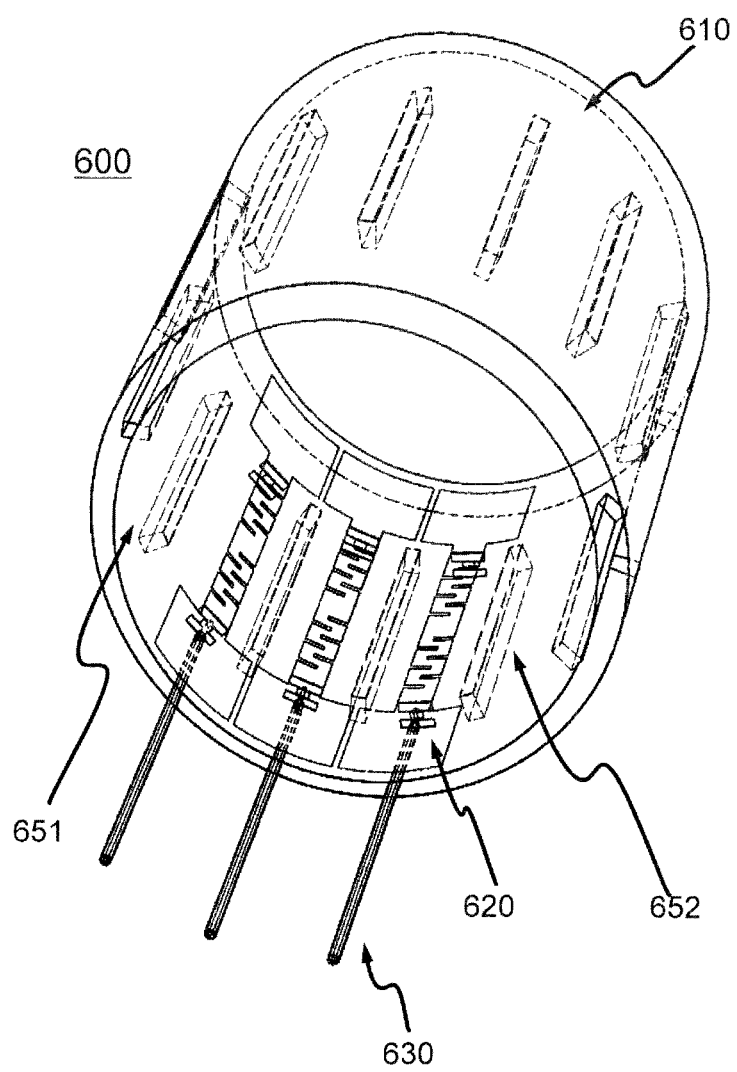
FIG. 14 is a perspective view of a modification example of the antenna device of the fourth embodiment.

FIG. 14 is an appearance diagram of an antenna device 600 of a modification example of the antenna device 500 of this embodiment. The antenna device 600 of this modification example includes a sheet-like conductor 610 and an antenna unit 620. FIG. 14 illustrates a case where three antenna units 620 are arranged inside a cylindrical sheet-like conductor 610 to configure a three-channel antenna device.

FIG. 15 is a diagram showing a state where the antenna unit 620 is extracted. The antenna unit 620 includes a pair of electric field conductors 622, one or more rung conductors 621 which connect the electric field conductors 622, frequency adjustment capacitor 623, and a connection terminal 624. A coaxial cable 630 which is connected to the apparatus body of the MRI apparatus 100 is connected to the connection terminal 624. The respective units have the same functions as the configuration with the same names in other embodiments. The arrangement and configuration are basically the same.

As shown in FIG. 15, the rung conductor 621 of this modification example is formed of a flat plate-like or tape-like conductor. The tape-like conductor includes notches 641 which are alternately recessed left and right.

The notches 641 are provided left and right, whereby the effective length of the rung conductor 621 is extended, and a current flows on the rung conductor 621 in a zigzag manner.

With the notches 641, it can be said that the rung conductor 621 of this modification example has a meander shape. The rung conductor 621 has a meander shape, whereby the inductance of the rung conductor 621 increases, and it is possible to decrease the resonance frequency of the antenna device 600 with the rung conductor 621 as a constituent element.

In this way, this modification example is useful when the inductance of the rung conductor 621 is desired to increase.

As shown in FIG. 14, the antenna device 600 of this modification example includes a thin cylindrical structure 651 as a housing portion which supports the rung conductor 621 and the electric field conductors 622 connected to both end portions of the rung conductor 621. The thin cylindrical structure 651 is formed of a material, such as FRP. The thin cylindrical structure 651 is connected to and supported by support members 652 arranged on the sheet-like conductor 610.

The support members 652 are formed of a material, such as FRP, and have a structure, such as a wall or a beam. The support members 652 are arranged to avoid a conductor portion, such as the rung conductor 621 and the electric field conductors 622. The reason for which the support members are arranged to avoid the conductor portion is to avoid creeping discharge by a high voltage.

The coaxial cable 630 which is used for at least one of transmission and reception is arranged between the thin cylindrical structure 651 and the sheet-like conductor 610. The thin structure 651 which supports the rung conductor 621 and the electric field conductors 622 connected to both end portions of the rung conductor 621, and the support members 652 can be applied as a conductor support structure to other embodiments.

As described above, the rung conductor in this embodiment may have various shapes, such as a spiral shape or a meander shape, as well as a linear shape, insofar as the rung conductor can configure a loop circuit along with the sheet-like conductor 510 and the frequency adjustment capacitor to function as an antenna.

In this embodiment, as in the first embodiment, various modifications may be made. For example, in order to adjust a resonance frequency, a configuration in which the capacitance of the capacitor by the electric field conductors 522 and the sheet-like conductor 510 is changed by the same method as in the first embodiment may be made. The position of the connection terminal with respect to the rung conductor 521 is not considered. Either transmission or reception may be realized. In this case, as in the first embodiment, a gap is provided between the rung conductor 521 and one of the electric field conductors 522, and the rung conductor 521 and one of the electric field conductors 522 are connected by a diode, thereby realizing detuning. In order to reduce coupling, a capacitor having capacitance of several pF may be connected between two adjacent electric field conductors 522. A plurality of rung conductors 321 may be provided for a pair of electric field conductors 522.

In this embodiment, although the antenna device 500 or 600 has been described with the four-channel antenna including the four antenna units 520 or 620 as an example, the number of antenna units (channels) is not limited thereto.

In the foregoing embodiments, although an example where an antenna device has a plurality of channel has been described, a one-channel antenna device having a sheet-like conductor and an antenna unit may be used. In the one-channel antenna device, although it is not necessary to take into consideration coupling between adjacent channels, according to the antenna device of each of the foregoing embodiments, the electric field conductors are provided, whereby it is possible to obtain an antenna device having a high degree of penetration of a magnetic field into the subject. For example, even in a high-magnetic field MRI apparatus, when inhomogeneity is less likely to occur in the spatial distribution of the RF magnetic field, or the like, it is not necessary to adjust inhomogeneity of the spatial distribution of the RF magnetic field using a multichannel antenna device. In this case, it is possible to realize an RF coil which improves penetration of the RF magnetic field into the subject using the one-channel antenna device of each embodiment under an environment in which the spatial distribution of the RF magnetic field is homogenous.

The antenna device of each of the foregoing embodiments can be applied to all instruments, which use an electromagnetic wave having a frequency of several MHz to several GHz, as well as the RF coil of the MRI apparatus.

REFERENCE SIGNS LIST

100: MRI apparatus, 101: magnet, 102: gradient magnetic field coil, 103: RF coil, 104: transceiver, 105: data processing unit, 106: transmission and reception cable, 107: gradient magnetic field control cable, 108: display device, 109: gradient magnetic field power source, 111: bed, 112: subject, 113: phantom, 200: antenna device, 210: sheet-like conductor, 220: antenna unit, 221: rung conductor, 222: electric field conductor, 223: frequency adjustment capacitor, 224: connection terminal, 230: coaxial cable, 241: gap, 300: antenna device, 310: sheet-like conductor, 320: antenna unit, 321: rung conductor, 322: electric field conductor, 323: frequency adjustment capacitor, 324: connection terminal, 324a: connection terminal, 324b: connection terminal, 324c: connection terminal, 330a: coaxial cable, 330b: coaxial cable, 330c: coaxial cable, 400: antenna device, 410: sheet-like conductor, 411: virtual elliptic cylinder, 420: antenna unit, 421: rung conductor, 422: electric field conductor, 430: coaxial cable, 441: slit, 442: bridge conductor, 500: antenna device, 510: sheet-like conductor, 520: antenna unit, 521: rung conductor, 522: electric field conductor, 541: folded portion, 542: reversely advance portion, 600: antenna device, 610: sheet-like conductor, 620: antenna unit, 621: rung conductor, 622: electric field conductor, 623: frequency adjustment capacitor, 624: connection terminal, 630: coaxial cable, 641: notch, 651: thin cylindrical structure, 652: support member, 701: current, 702: magnetic flux line, 703: eddy current, 711: voltage, 712: electric field, 713: current, 721: current, 722: magnetic field, 723: current, 724: electric charge, 725: electric charge, 726: current, 801: voltage, 802: voltage

The invention claimed is:

1. A magnetic resonance imaging apparatus comprising:
a magnet which generates a magnetostatic field and forms a magnetostatic field; and
an RF coil which performs at least one of transmission of a high-frequency signal to the magnetostatic field and reception of a nuclear magnetic resonance signal generated from a subject placed inside the magnetostatic field, wherein the RF coil includes:
a sheet-like conductor; and
an antenna unit comprising
a rung conductor which is arranged at a predetermined distance from the sheet-like conductor, and
two electric field conductors which are arranged in both end portions of the rung conductor at a predetermined distance from the sheet-like conductor; and a loop circuit that includes the rung conductor and the sheet-like conductor and resonates at the frequency of the high-frequency signal transmitted from the RF coil or the nuclear magnetic resonance signal received by the RF coil.

2. The magnetic resonance imaging apparatus according to claim 1,
wherein the electric field conductors generate an electric field for suppressing a shielding current flowing on the surface of the subject by a magnetic field produced by a current flowing in the rung conductor.

3. The magnetic resonance imaging apparatus according to claim 1,
wherein the RF coil is a multichannel antenna including a plurality of antenna units, and
the electric field conductors of each antenna unit cause the electric field conductors of the adjacent antenna unit to generate a voltage for suppressing magnetic field coupling between the rung conductors of the adjacent antenna units.

4. The magnetic resonance imaging apparatus according to claim 1, wherein the width of each of the electric field conductors in a minor axis direction of the rung conductor is wider than the width of the rung conductor.

5. The magnetic resonance imaging apparatus according to claim 3, wherein the space between the electric field conductors of the adjacent antenna units is narrower than the space between the rung conductors of the adjacent antenna units.

6. The magnetic resonance imaging apparatus according to claim 1, further comprising:
two frequency adjustment capacitors which connect both end portions of the rung conductor and the sheet-like conductor substantially directly beneath the rung conductor,
wherein the value of each of the frequency adjustment capacitors is adjusted such that the loop circuit resonates at the frequency of the high-frequency signal or the nuclear magnetic resonance signal.

7. The magnetic resonance imaging apparatus according to claim 1,
wherein the rung conductor has a shape in which the length of the rung conductor is adjustable, and
the length of the rung conductor is adjusted such that the loop circuit resonates at the frequency of the high-frequency signal or the nuclear magnetic resonance signal.

8. The magnetic resonance imaging apparatus according to claim 1, wherein the antenna unit includes a plurality of rung conductors.

9. The magnetic resonance imaging apparatus according to claim 1,
wherein a plurality of antenna units are provided,
each of the antenna units includes a connection terminal which connects the RF coil to the magnetic resonance imaging apparatus,
the connection terminal is connected to the rung conductor and the sheet-like conductor,
the sheet-like conductor has a tubular shape, and
the phase and amplitude of a voltage supplied to each antenna unit through each connection terminal are controlled separately such that the high-frequency signal transmitted from the RF coil is optimized.

10. The magnetic resonance imaging apparatus according to claim 9, wherein the sheet-like conductor has an elliptic cylindrical shape.

11. The magnetic resonance imaging apparatus according to claim 10, wherein the antenna unit is arranged on a virtual curve with a decreasing distance from the sheet-like conductor along a major axis radial direction of a section of the elliptic cylinder.

12. The magnetic resonance imaging apparatus according to claim 1, wherein the rung conductor and the electric field conductors are electrically connected together.

13. The magnetic resonance imaging apparatus according to claim 2, wherein the electric field conductors have an area which is determined so as to generate the electric field.

14. The magnetic resonance imaging apparatus according to claim 2,
wherein the rung conductor and the electric field conductors are not electrically connected,
a voltage is provided to the electric field conductors separately from the rung conductor, and
the voltage has magnitude to generate the electric field.

15. The magnetic resonance imaging apparatus according to claim 1, further comprising:
gradient magnetic field application means for applying a gradient magnetic field which provides positional information to the nuclear magnetic resonance signal,
wherein each of the electric field conductors includes
a slit, and
a slit connection capacitor which connects both sides of the slit, and
the slit connection capacitor is adjusted such that both sides of the slit are electrically disconnected from each other at the frequency of an AC magnetic field to be used in the gradient magnetic field.

16. The magnetic resonance imaging apparatus according to claim 3, further comprising:
a coupling reduction capacitor which connects the electrical conductors of adjacent channels and suppresses the magnetic field coupling.

17. The magnetic resonance imaging apparatus according to claim 7, wherein the rung conductor has a spiral shape.

18. The magnetic resonance imaging apparatus according to claim 7, wherein the rung conductor has a flat plate shape and includes notches which are alternately recessed left and right.

19. A magnetic resonance imaging apparatus comprising:
a magnet which generates a magnetostatic field and forms a magnetostatic field; and
an RF coil which performs either transmission of a high-frequency signal to the magnetostatic field or reception of a nuclear magnetic resonance signal generated from a subject placed inside the magnetostatic field, wherein the RF coil includes
a sheet-like conductor, and
an antenna unit,
the antenna unit includes
a rung conductor which is arranged at a predetermined distance from the sheet-like conductor,
two electric field conductors which are arranged in both end portions of the rung conductor at a predetermined distance from the sheet-like conductor, and
a diode which connects the rung conductor and one of the electric field conductors, and
the rung conductor and the sheet-like conductor configure a loop circuit which resonates at the frequency of the high-frequency signal transmitted from the RF coil or the nuclear magnetic resonance signal received by the RF coil.

20. An antenna device comprising:
a sheet-like conductor;
an antenna unit including
- a rung conductor which is arranged at a predetermined distance from the sheet-like conductor, and
- two electric field conductors which are arranged in both end portions of the rung conductor at a predetermined distance from the sheet-like conductor; and a loop circuit that includes the rung conductor and the sheet-like conductor and resonates at a preset frequency.

\* \* \* \* \*